(12) United States Patent
Kim et al.

(10) Patent No.: US 11,774,642 B2
(45) Date of Patent: Oct. 3, 2023

(54) OPTICAL FILM ARRANGEMENTS FOR ELECTRONIC DEVICE DISPLAYS

(71) Applicant: Apple Inc., Cupertino, CA (US)

(72) Inventors: ByoungSuk Kim, Palo Alto, CA (US); Yi Huang, San Jose, CA (US); Jun Qi, San Jose, CA (US); Victor H. Yin, Cupertino, CA (US); Seung Wook Kim, San Jose, CA (US); Nicolas V. Scapel, London (GB); Yi-Pai Huang, Cupertino, CA (US)

(73) Assignee: Apple Inc., Cupertino, CA (US)

(*) Notice: Subject to any disclaimer, the term of this patent is extended or adjusted under 35 U.S.C. 154(b) by 195 days.

(21) Appl. No.: 17/005,199

(22) Filed: Aug. 27, 2020

(65) Prior Publication Data

US 2021/0072555 A1   Mar. 11, 2021

Related U.S. Application Data

(60) Provisional application No. 62/987,674, filed on Mar. 10, 2020, provisional application No. 62/897,078, (Continued)

(51) Int. Cl.
*G02B 3/00* (2006.01)
*G02B 27/01* (2006.01)
(Continued)

(52) U.S. Cl.
CPC ......... *G02B 3/005* (2013.01); *G02B 27/0172* (2013.01); *G02B 30/27* (2020.01);
(Continued)

(58) Field of Classification Search
CPC ............ H01L 51/5262; H01L 51/5275; H01L 51/5281; H01L 51/5284;
(Continued)

(56) References Cited

U.S. PATENT DOCUMENTS

| 5,956,001 A | * | 9/1999 | Sumida | ................ H04N 13/337 348/E13.043 |
| 7,070,278 B2 | | 7/2006 | Pezzaniti | |

(Continued)

FOREIGN PATENT DOCUMENTS

| CN | 103609108 A | 2/2014 |
| CN | 104749786 A | 7/2015 |

(Continued)

*Primary Examiner* — Mariceli Santiago
(74) *Attorney, Agent, or Firm* — Treyz Law Group, P.C.; Joseph F. Guihan

(57) ABSTRACT

A lenticular display may be formed with convex curvature. The lenticular display may have a lenticular lens film with lenticular lenses that extend across the length of the display. The lenticular lenses may be configured to enable stereoscopic viewing of the display. To enable more curvature in the display while ensuring satisfactory stereoscopic display performance, the display may have stereoscopic zones and non-stereoscopic zones. A central stereoscopic zone may be interposed between first and second non-stereoscopic zones. The non-stereoscopic zones may have more curvature than the stereoscopic zone. To prevent crosstalk within the lenticular display, a louver film may be incorporated into the display. The louver film may have a plurality of transparent portions separated by opaque walls. The opaque walls may control the emission angle of light from the display, reducing crosstalk. The louver film may be interposed between the lenticular lens film and the display panel.

19 Claims, 29 Drawing Sheets

Related U.S. Application Data filed on Sep. 6, 2019, provisional application No. 62/897,093, filed on Sep. 6, 2019.

(51) Int. Cl.

| | |
|---|---|
| *G06F 1/16* | (2006.01) |
| *H04N 13/305* | (2018.01) |
| *H04N 13/383* | (2018.01) |
| *G02B 30/29* | (2020.01) |
| *G02B 30/27* | (2020.01) |
| *G02F 1/17* | (2019.01) |
| *H10K 50/86* | (2023.01) |
| *H10K 50/858* | (2023.01) |
| *H10K 59/12* | (2023.01) |

(52) U.S. Cl.
CPC .............. *G02B 30/29* (2020.01); *G02F 1/17* (2013.01); *G06F 1/1609* (2013.01); *H04N 13/305* (2018.05); *H04N 13/383* (2018.05); *H10K 50/858* (2023.02); *H10K 50/86* (2023.02); *H10K 50/865* (2023.02); *H10K 59/12* (2023.02); *G02B 2027/0134* (2013.01); *G02B 2027/0187* (2013.01); *G02B 2207/123* (2013.01)

(58) Field of Classification Search
CPC ........ G02B 30/27–29; G02B 2207/123; G02B 5/003; H04N 13/305; H10K 77/10–111; H10K 50/858–865
See application file for complete search history.

(56) References Cited

U.S. PATENT DOCUMENTS

| | | | |
|---|---|---|---|
| 7,736,005 B2 | 6/2010 | Saishu et al. | |
| 8,305,743 B2 | 11/2012 | Wu et al. | |
| 2006/0176245 A1* | 8/2006 | Sakai | G02B 30/27 345/53 |
| 2009/0052026 A1 | 2/2009 | Takagi et al. | |
| 2009/0244682 A1 | 10/2009 | Saishu et al. | |
| 2010/0157577 A1 | 6/2010 | Montgomery et al. | |
| 2012/0127376 A1* | 5/2012 | Shikina | H01L 51/5275 348/800 |
| 2013/0155052 A1 | 6/2013 | Ko | |
| 2014/0043323 A1 | 2/2014 | Sumi | |
| 2015/0009560 A1 | 1/2015 | Kang et al. | |
| 2015/0138457 A1* | 5/2015 | Kroon | G02B 30/25 359/463 |
| 2015/0277131 A1 | 10/2015 | Park et al. | |
| 2015/0286457 A1 | 10/2015 | Kim et al. | |
| 2016/0021367 A1 | 1/2016 | Yoon et al. | |
| 2016/0077348 A1 | 3/2016 | Kang | |
| 2016/0349523 A1 | 12/2016 | Wei | |
| 2017/0097535 A1 | 4/2017 | Andou et al. | |
| 2017/0223344 A1 | 8/2017 | Kaehler | |
| 2018/0373101 A1 | 12/2018 | Chen | |
| 2022/0223824 A1* | 7/2022 | You | H01L 51/5275 |

FOREIGN PATENT DOCUMENTS

| | | | | |
|---|---|---|---|---|
| CN | 104965308 A | | 10/2015 | |
| JP | H07028178 A | | 1/1995 | |
| JP | H07250352 A | | 9/1995 | |
| JP | 2000102038 A | | 4/2000 | |
| JP | 2000267582 A | * | 9/2000 | |
| JP | 2000305041 A | | 11/2000 | |
| JP | 2005031367 A | * | 2/2005 | |
| JP | 2005031367 A | | 2/2005 | |
| JP | 2007171539 A | * | 7/2007 | |
| JP | 2007519033 A | | 7/2007 | |
| JP | 2007271751 A | | 10/2007 | |
| JP | 2012198432 A | * | 10/2012 | |
| JP | 2013068683 A | | 4/2013 | |
| JP | 2014063159 A | | 4/2014 | |
| JP | 2017529724 A | | 10/2017 | |
| KR | 20130070766 A | | 6/2013 | |
| KR | 20150114623 A | | 10/2015 | |
| KR | 20160010169 A | | 1/2016 | |
| KR | 20160091498 A | | 8/2016 | |
| KR | 20170140393 A | | 12/2017 | |
| WO | WO-2012068543 A1 | * | 5/2012 | ............. F21K 9/232 |
| WO | WO-2016057588 A2 | * | 4/2016 | ........... G02B 3/0031 |
| WO | 2017126540 A1 | | 7/2017 | |

* cited by examiner

ОPTICAL FILM ARRANGEMENTS FOR ELECTRONIC DEVICE DISPLAYS

This application claims the benefit of provisional patent application No. 62/897,078, filed Sep. 6, 2019, provisional patent application No. 62/897,093, filed Sep. 6, 2019, and provisional patent application No. 62/987,674, filed Mar. 10, 2020, which are hereby incorporated by reference herein in their entireties.

FIELD

This relates generally to electronic devices, and, more particularly, to electronic devices with displays.

BACKGROUND

Electronic devices often include displays. In some cases, displays may include lenticular lenses that enable the display to provide three-dimensional content to the viewer. The lenticular lenses may be formed over an array of pixels such as organic light-emitting diode pixels or liquid crystal display pixels.

If care is not taken, it may be difficult to provide lenticular displays with desired form factors. Lenticular displays may also be susceptible to crosstalk and other visible artifacts at wide viewing angles.

SUMMARY

An electronic device may include a lenticular display. The lenticular display may have a lenticular lens film formed over an array of pixels. A plurality of lenticular lenses may extend across the length of the display. The lenticular lenses may be configured to enable stereoscopic viewing of the display such that a viewer perceives three-dimensional images.

It may be desirable for a lenticular display to have convex curvature based on a desired form factor for the electronic device. To enable more curvature in the display while ensuring satisfactory display performance, the display may have stereoscopic zones and non-stereoscopic zones. The stereoscopic zones may be configured to present three-dimensional content whereas the non-stereoscopic zones may be configured to present two-dimensional content. A central stereoscopic zone may be interposed between first and second non-stereoscopic zones. The non-stereoscopic zones may have more curvature than the stereoscopic zone.

To prevent crosstalk within the lenticular display, a louver film may be incorporated into the display. The louver film may have a plurality of transparent portions separated by opaque walls. The opaque walls may control the emission angle of light from the display, reducing crosstalk. The louver film may be interposed between the lenticular lens film and the display panel, or the lenticular lens film may be interposed between the display panel and the louver film.

Pixel arrays may have a diagonal pixel pattern with each row shifted laterally relative to the preceding row. The overlying lenticular lenses may be vertically oriented, resulting in a non-zero angle between the pixel pattern and the lenticular lenses. Various pixel layouts may be used in the diagonal pixel pattern to mitigate cross-talk.

DETAILED DESCRIPTION

Figure 1:
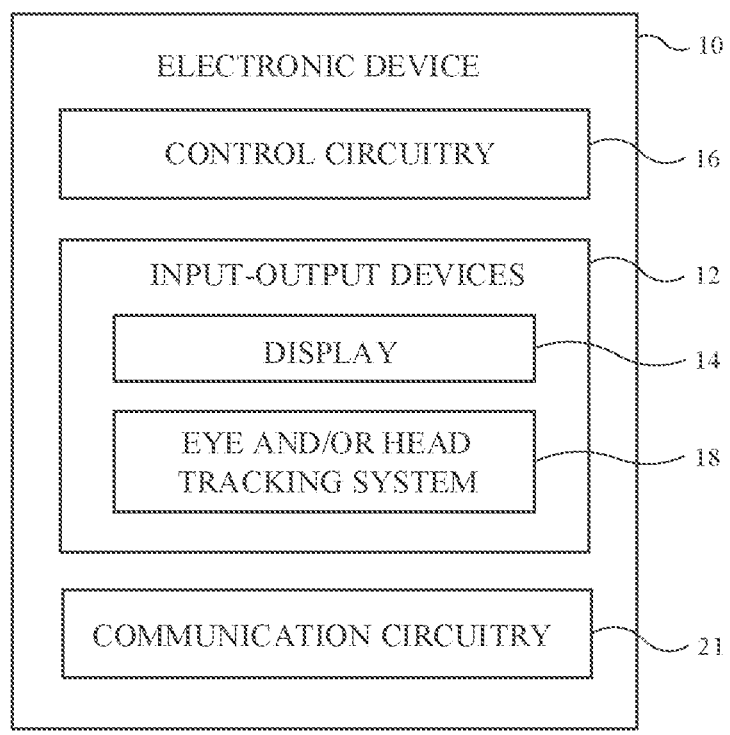
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, an augmented reality (AR) headset and/or virtual reality (VR) headset, a device embedded in eyeglasses or other equipment worn on a user's head, or other wearable or miniature device, a display, a computer display that contains an embedded computer, a computer display that does not contain an embedded computer, a gaining device, a navigation device, an embedded system such as a system in which electronic equipment with a display is mounted in a kiosk or automobile, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

To support communications between device 10 and external equipment, control circuitry 16 may communicate using communications circuitry 21. Circuitry 21 may include antennas, radio-frequency transceiver circuitry, and other wireless communications circuitry and/or wired communications circuitry. Circuitry 21, which may sometimes be referred to as control circuitry and/or control and communications circuitry, may support bidirectional wireless communications between device 10 and external equipment over a wireless link (e.g., circuitry 21 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a 60 (Hz link or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, and other electrical components. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Some electronic devices may include two displays. In one possible arrangement, a first display may be positioned on one side of the device and a second display may be positioned on a second, opposing side of the device. The first and second displays therefore may have a back-to-back arrangement. One or both of the displays may be curved.

Sensors in input-output devices 12 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors in input-output devices 12 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors) health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors.

Control circuitry 16 may be used to run software on device 10 such as operating system code and applications. During operation of device 10, the software running on control circuitry 16 may display images on display 14 using an array of pixels in display 14.

Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Configurations in which display 14 is an organic light-emitting diode display are sometimes described herein as an example.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Device 10 may include cameras and other components that form part of gaze and/or head tracking system 18. The camera(s) or other components of system 18 may face a user's eyes and may track the user's eyes and/or head (e.g., images and other information captured by system 18 may be analyzed by control circuitry 16 to determine the location of the user's eyes and/or head). This eye-location information obtained by system 18 may be used to determine the appropriate direction with which display content from display 14 should be directed. If desired, image sensors other than cameras (e.g., infrared and/or visible light-emitting diodes and light detectors, etc.) may be used in system 18 to monitor a user's eye and/or head location.

Figure 2:
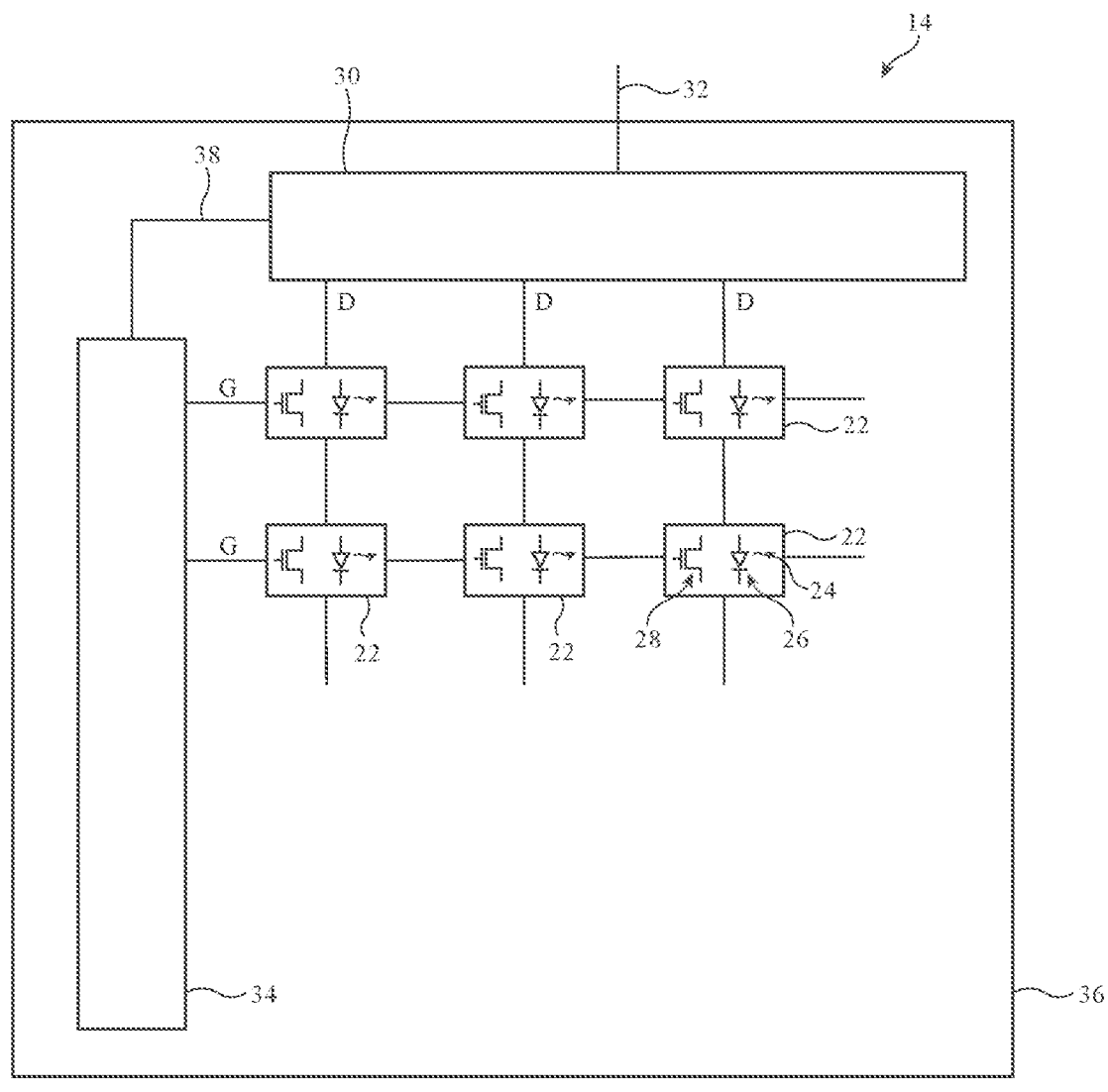
FIG. 2 is a top view of an illustrative display in an electronic device in accordance with an embodiment.

A top view of a portion of display 14 is shown in FIG. 2. As shown in FIG. 2, display 14 may have an array of pixels 22 formed on substrate 36. Substrate 36 may be formed from glass, metal, plastic, ceramic, or other substrate materials. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel circuit formed from thin-film transistor circuitry (such as thin-film transistors 28 and thin-film capacitors). Thin-film transistors 28 may be polysilicon thin-film transistors, semiconducting-oxide thin-film transistors such as indium gallium zinc oxide transistors, or thin-film transistors formed from other semiconductors. Pixels 22 may contain light-emitting diodes of different colors (e.g., red, green, and blue diodes for red, green, and blue pixels, respectively) to provide display 14 with the ability to display color images.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, circuitry 30 may also supply clock signals and other control signals to gate driver circuitry on an opposing edge of display 14.

Gate driver circuitry 34 (sometimes referred to as horizontal control line control circuitry) may be implemented as part of an integrated circuit and/or may be implemented using thin-film transistor circuitry. Horizontal control lines G in display 14 may carry gate line signals (scan line signals), emission enable control signals, and other horizontal control signals for controlling the pixels of each row. There may be any suitable number of horizontal control signals per row of pixels 22 (e.g., one or more, two or more, three or more, four or more, etc.).

Display 14 may sometimes be a stereoscopic display that is configured to display three-dimensional content for a viewer. Stereoscopic displays are capable of displaying multiple two-dimensional images that are viewed from slightly different angles. When viewed together, the combination of the two-dimensional images creates the illusion of a three-dimensional image for the viewer. For example, a viewer's left eye may receive a first two-dimensional image and a viewer's right eye may receive a second, different two-dimensional image. The viewer perceives these two different two-dimensional images as a single three-dimensional image.

There are numerous ways to implement a stereoscopic display. Display 14 may be a lenticular display that uses lenticular lenses (e.g., elongated lenses that extend along parallel axes), may be a parallax barrier display that uses parallax barriers (e.g., an opaque layer with precisely spaced slits to create a sense of depth through parallax), may be a volumetric display, or may be any other desired type of stereoscopic display. Configurations in which display 14 is a lenticular display are sometimes described herein as an example.

Figure 3:
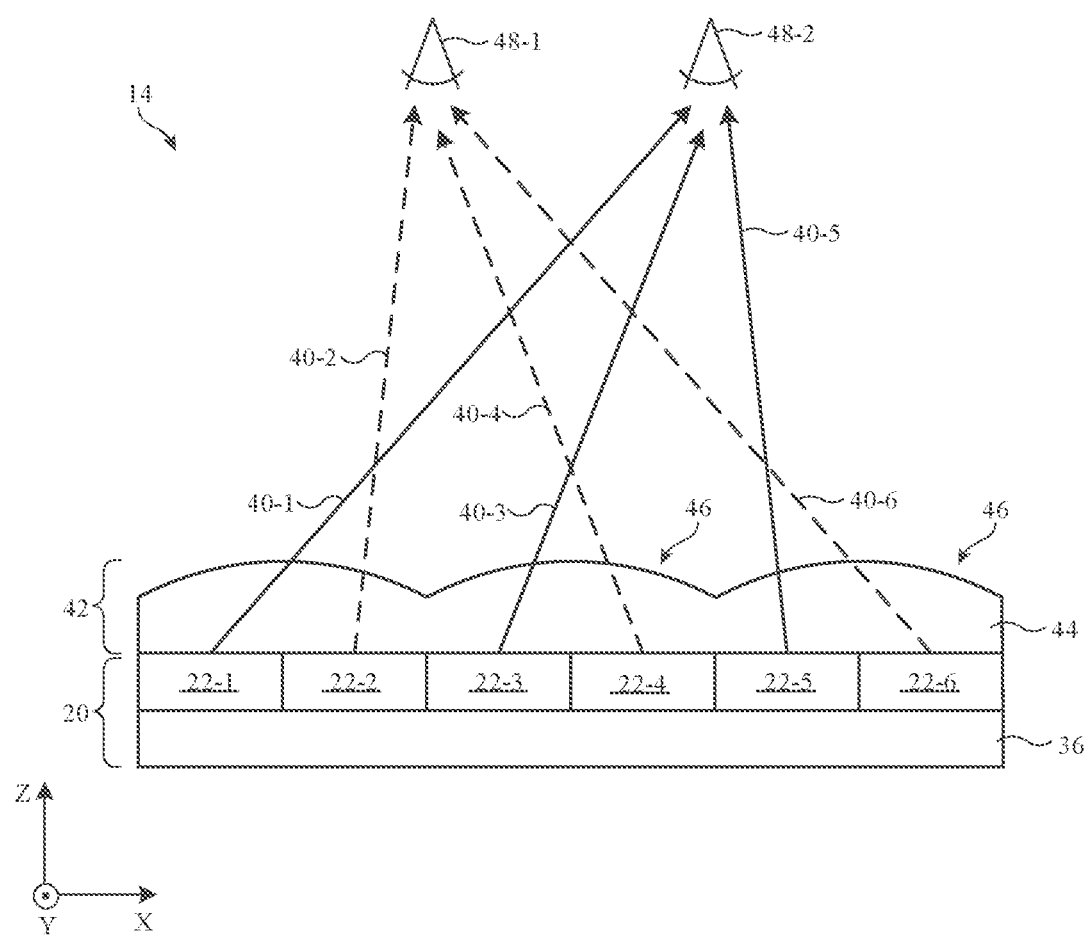
FIG. 3 is a cross-sectional side view of an illustrative lenticular display that provides images to a viewer in accordance with an embodiment.

FIG. 3 is a cross-sectional side view of an illustrative lenticular display that may be incorporated into electronic device 10. Display 14 includes a display panel 20 with pixels 22 on substrate 36. Substrate 36 may be formed from glass, metal, plastic, ceramic, or other substrate materials and pixels 22 may be organic light-emitting diode pixels, liquid crystal display pixels, or any other desired type of pixels.

As shown in FIG. 3, lenticular lens film 42 may be formed over the display pixels. Lenticular lens film 42 (sometimes referred to as a light redirecting film, a lens film, etc.) includes lenses 46 and a base film portion 44 (e.g., a planar film portion to which lenses 46 are attached). Lenses 46 may be lenticular lenses that extend along respective longitudinal axes (e.g., axes that extend into the page parallel to the Y-axis). Lenses 46 may be referred to as lenticular elements 46, lenticular lenses 46, optical elements 46, etc.

The lenses 46 of the lenticular lens film cover the pixels of display 14. An example is shown in FIG. 3 with display pixels 22-1, 22-2, 22-3, 22-4, 22-5, and 22-6. In this example, display pixels 22-1 and 22-2 are covered by a first lenticular lens 46, display pixels 22-3 and 22-4 are covered by a second lenticular lens 46, and display pixels 22-5 and 22-6 are covered by a third lenticular lens 46. The lenticular lenses may redirect light from the display pixels to enable stereoscopic viewing of the display.

Consider the example of display 14 being viewed by a viewer with a first eye (e.g., a right eye) 48-1 and a second eye (e.g., a left eye) 48-2. Light from pixel 22-1 is directed by the lenticular lens film in direction 40-1 towards left eye 48-2, light from pixel 22-2 is directed by the lenticular lens film in direction 40-2 towards right eye 48-1, light from pixel 22-3 is directed by the lenticular lens film in direction 40-3 towards left eye 48-2, light from pixel 22-4 is directed by the lenticular lens film in direction 40-4 towards right eye 48-1, light from pixel 22-5 is directed by the lenticular lens film in direction 40-5 towards left eye 48-2, light from pixel 22-6 is directed by the lenticular lens film in direction 40-6 towards right eye 48-1. In this way, the viewer's right eye 48-1 receives images from pixels 22-2, 22-4, and 22-6, whereas left eye 48-2 receives images from pixels 22-1.22-3, and 22-5. Pixels 22-2.22-4, and 22-6 may be used to display a slightly different image than pixels 22-1, 22-3, and 22-5. Consequently, the viewer may perceive the received images as a single three-dimensional image.

Pixels of the same color may be covered by a respective lenticular lens 46. In one example, pixels 22-1 and 22-2 may be red pixels that emit red light, pixels 22-3 and 22-4 may be green pixels that emit green light, and pixels 22-5 and 22-6 may be blue pixels that emit blue light. This example is merely illustrative. In general, each lenticular lens may cover any desired number of pixels each having any desired color. The lenticular lens may cover a plurality of pixels having the same color, may cover a plurality of pixels each having different colors, may cover a plurality of pixels with some pixels being the same color and some pixels being different colors, etc.

Figure 4:
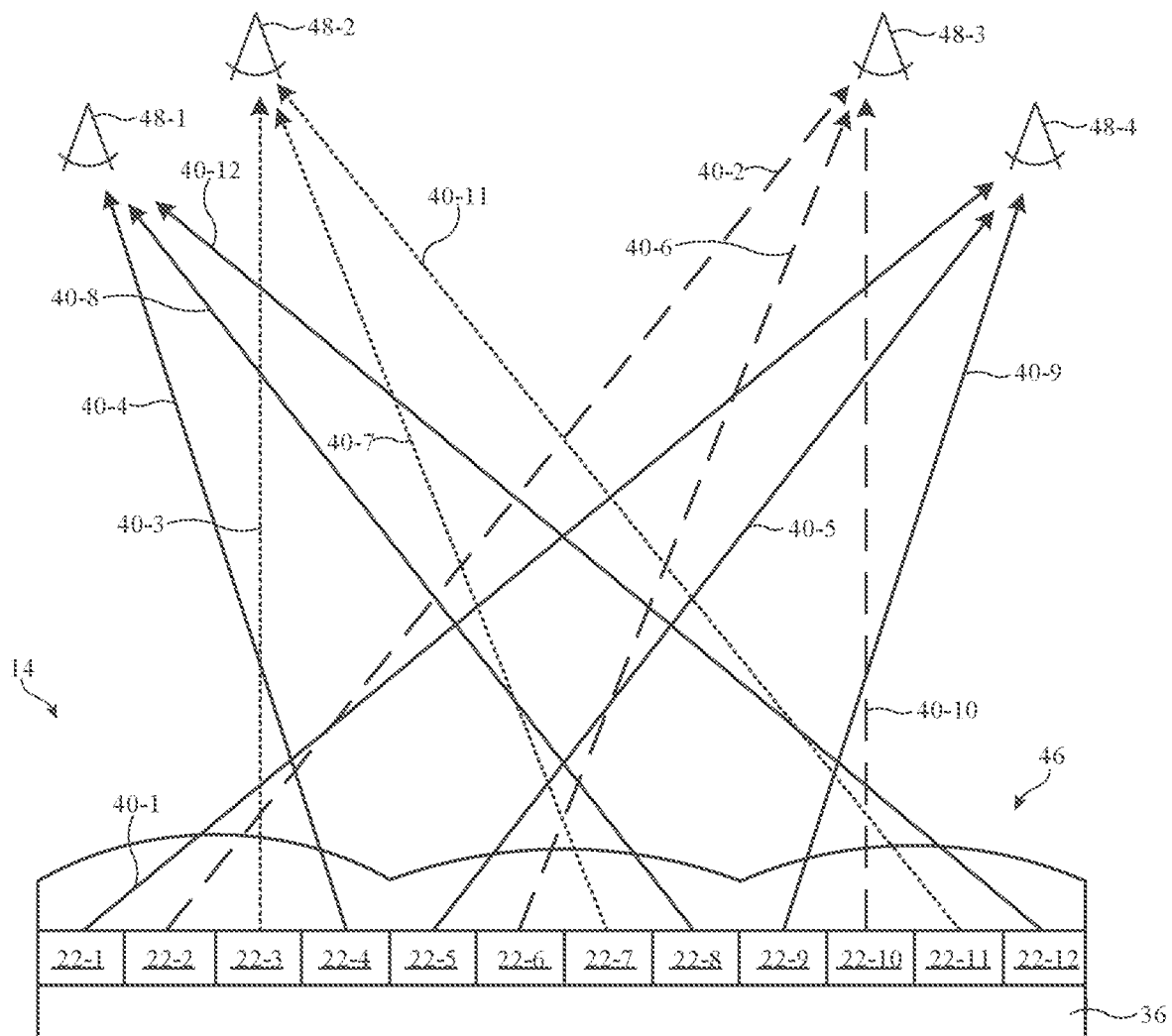
FIG. 4 is across-sectional side view of an illustrative lenticular display that provides images to two or more viewers in accordance with an embodiment.

FIG. 4 is a cross-sectional side view of an illustrative stereoscopic display showing how the stereoscopic display may be viewable by multiple viewers. The stereoscopic display of FIG. 3 may have one optimal viewing position (e.g., one viewing position where the images from the display are perceived as three-dimensional). The stereoscopic display of FIG. 4 may have two optimal viewing positions (e.g., two viewing positions where the images from the display are perceived as three-dimensional).

Display 14 may be viewed by both a first viewer with a right eye 48-1 and a left eye 48-2 and a second viewer with a right eye 48-3 and a left eye 48-4. Light from pixel 22-1 is directed by the lenticular lens film in direction 40-1 towards left eye 48-4, light from pixel 22-2 is directed by the lenticular lens film in direction 40-2 towards right eye 48-3, light from pixel 22-3 is directed by the lenticular lens film in direction 40-3 towards left eye 48-2, light from pixel 22-4 is directed by the lenticular lens film in direction 40-4 towards right eye 48-1, light from pixel 22-5 is directed by the lenticular lens film in direction 40-5 towards left eye 48-4, light from pixel 22-6 is directed by the lenticular lens film in direction 40-6 towards right eye 48-3, light from pixel 22-7 is directed by the lenticular lens film in direction 40-7 towards left eye 48-2, light from pixel 22-8 is directed by the lenticular lens film in direction 40-8 towards right eye 48-1, light from pixel 22-9 is directed by the lenticular lens film in direction 40-9 towards left eye 48-4, light from pixel 22-10 is directed by the lenticular lens film in direction 40-10 towards right eye 48-3, light from pixel 22-11 is directed by the lenticular lens film in direction 40-11 towards left eye 48-2, and light from pixel 22-12 is directed by the lenticular lens film in direction 40-12 towards right eye 48-1. In this way, the first viewer's right eye 48-1 receives images from pixels 22-4, 22-8, and 22-12, whereas left eye 48-2 receives images from pixels 22-3, 22-7, and 22-11. Pixels 22-4, 22-8, and 22-12 may be used to display a slightly different image than pixels 22-3, 22-7, and 22-11. Consequently, the first viewer may perceive the received images as a single three-dimensional image. Similarly, the second viewer's right eye 48-3 receives images from pixels 22-2, 22-6, and 22-10, whereas left eye 48-4 receives images from pixels 22-1, 22-5, and 22-9. Pixels 22-2, 22-6, and 22-10 may be used to display a slightly different image than pixels 22-1, 22-5, and 22-9. Consequently, the second viewer may perceive the received images as a single three-dimensional image.

Pixels of the same color may be covered by a respective lenticular lens 46. In one example, pixels 22-1, 22-2, 22-3, and 22-4 may be red pixels that emit red light, pixels 22-5, 22-6.22-7, and 22-8 may be green pixels that emit green light, and pixels 22-9.22-10, 22-11, and 22-12 may be blue pixels that emit blue light. This example is merely illustrative. The display may be used to present the same three-dimensional image to both viewers or may present different three-dimensional images to different viewers. In some cases, control circuitry in the electronic device 10 may use eye and/or head tracking system 18 to track the position of one or more viewers and display content on the display based on the detected position of the one or more viewers.

It should be understood that the lenticular lens shapes and directional arrows of FIGS. 3 and 4 are merely illustrative. The actual rays of light from each pixel may follow more complicated paths (e.g., with redirection occurring due to refraction, total internal reflection, etc.). Additionally, light from each pixel may be emitted over a range of angles. The lenticular display may also have lenticular lenses of any desired shape or shapes. Each lenticular lens may have a width that covers two pixels, three pixels, four pixels, more than four pixels, more than ten pixels, etc. Each lenticular lens may have a length that extends across the entire display (e.g., parallel to columns of pixels in the display).

Figure 5:
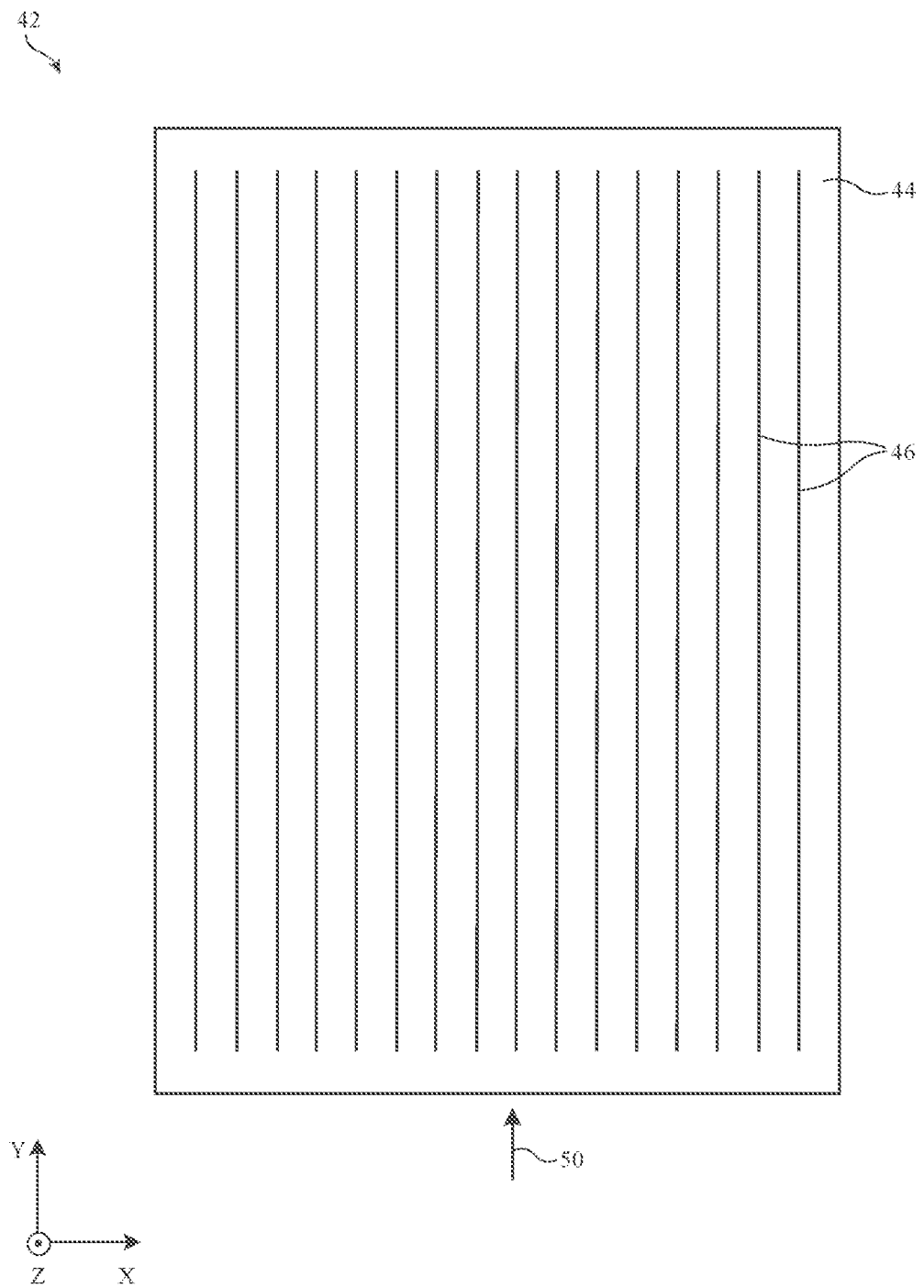
FIG. 5 is a top view of an illustrative lenticular lens film showing the elongated shape of the lenticular lenses in accordance with an embodiment.

FIG. 5 is a top view of an illustrative lenticular lens film that may be incorporated into a lenticular display. As shown in FIG. 5, elongated lenses 46 extend across the display parallel to the Y-axis. For example, the cross-sectional side view of FIGS. 3 and 4 may be taken looking in direction 50. The lenticular display may include any desired number of lenticular lenses 46 (e.g., more than 10, more than 100, more than 1,000, more than 10,000, etc.).

Figure 6:
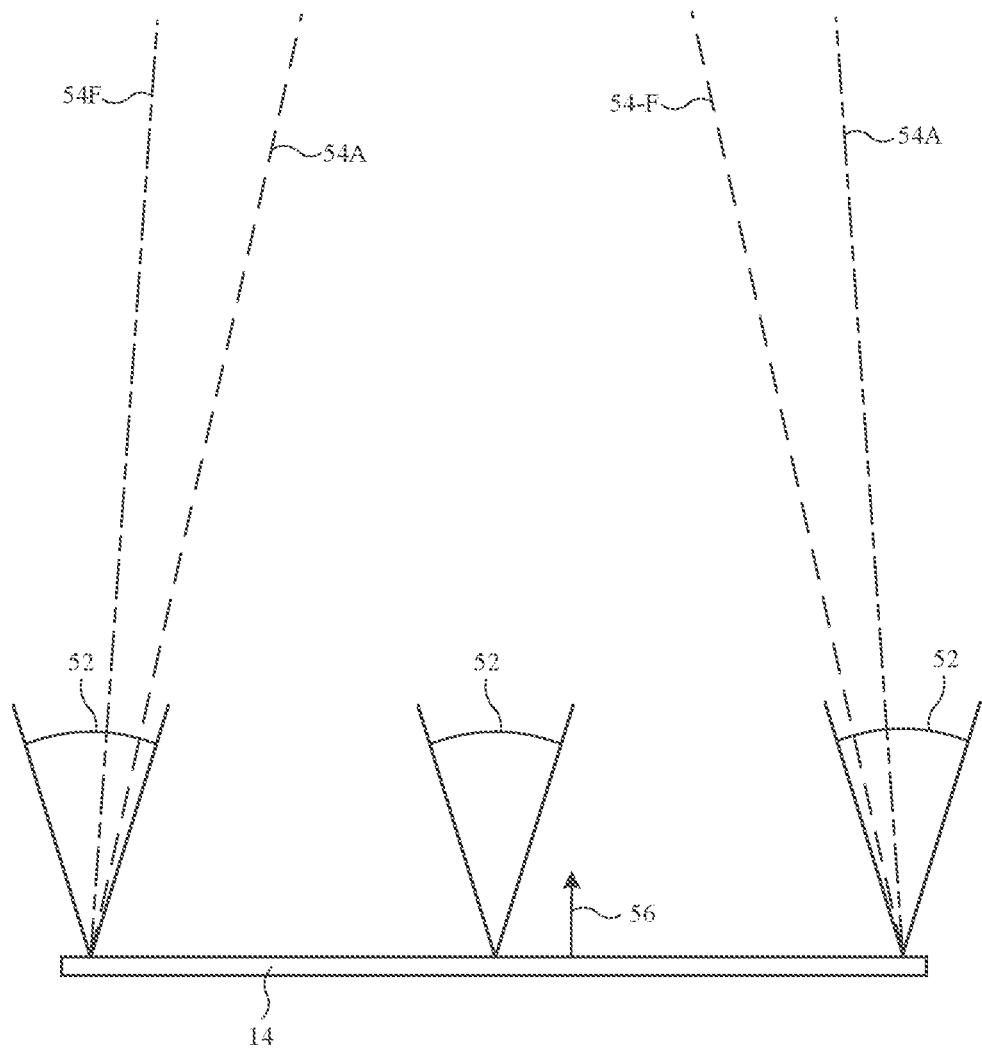
FIG. 6 is a cross-sectional view of an illustrative planar lenticular display showing the emission area of the display relative to the viewing area in accordance with an embodiment.

FIG. 6 is a side view of an illustrative planar lenticular display. The pixels in the display may emit light over an emission angle 52 (sometimes referred to as an emission cone) that is controlled at least in part by the lenticular lens film of the display. The display may be viewable across a range of viewing angles that correspond to the emission angles of the display pixels. For example, viewing cone 54F may correspond to a viewer looking at display 14 from the front of the display (e.g., at an on-axis direction parallel to the display's surface normal 56). Viewing cone 54A may correspond to a viewer looking at display 14 in a direction that is angled by 15° relative to the surface normal 56. As shown in FIG. 6, from both the front view 54F and angled view 54A, the viewing cone overlaps the emission cones of the display pixels. Therefore, a viewer may properly see the pixels on both the left side of the display, the center of the display, and the right side of the display. This may be true across viewing angles from 0° (e.g., parallel to the surface normal) to ±15°. Beyond 15°, the viewer may not be able to properly see certain pixels (e.g., pixels at the edges of the display). The lenticular lens film used in the display of FIG. 6 may therefore be considered a 15° field-of-view film (because the film enables a viewer to properly view the display at angles between −15° and +15° relative to the surface normal of the display).

FIG. 6 shows an example of a planar display. However, in some electronic devices, it may be desirable for display 14 to be curved. Curving display 14 may allow the display to conform to a desired form factor for the electronic device 10, may provide a desired aesthetic appearance, etc. The display may have concave curvature or convex curvature.

Providing curvature in a lenticular display may impact the performance of the lenticular display. In particular, the curvature of the display means that the angle of the surface of the display relative to the viewer is not constant. This may make it difficult for all of the pixels in the lenticular display to be properly viewable.

Figure 7:
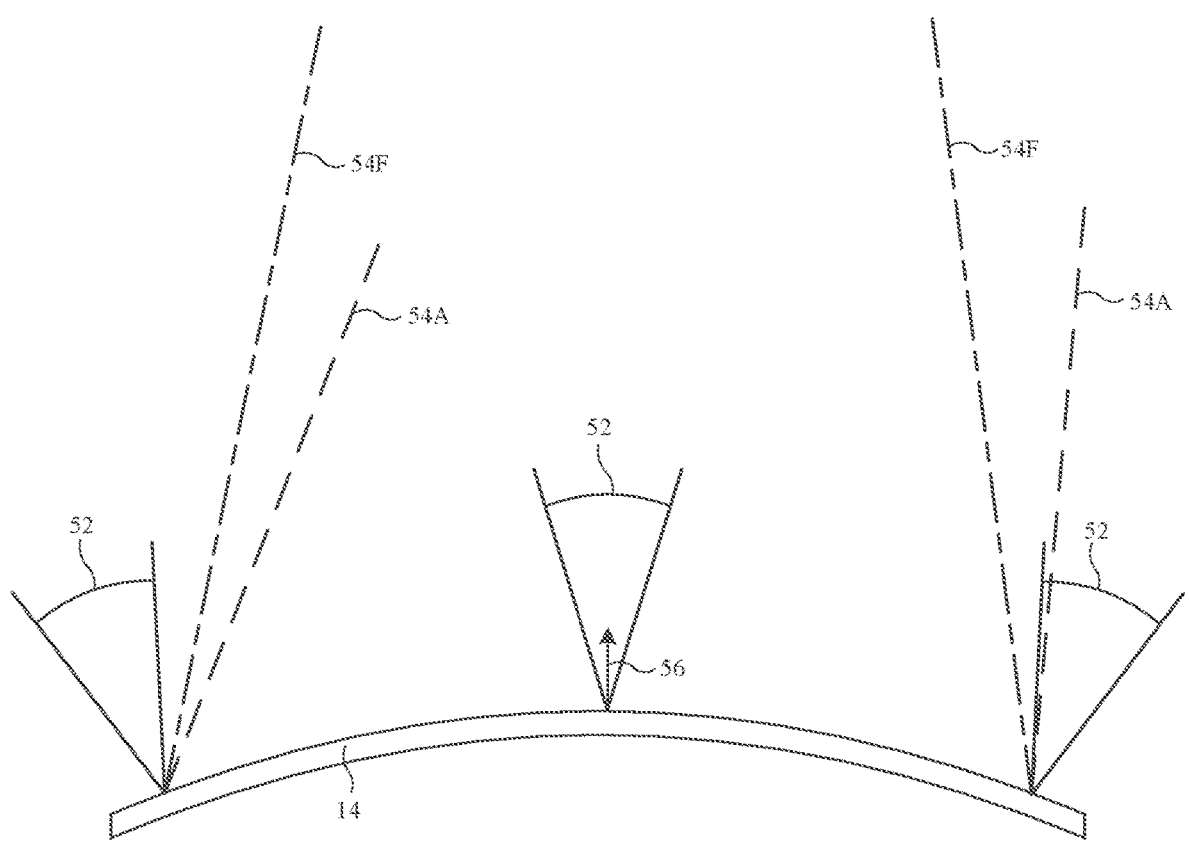
FIG. 7 is a cross-sectional side view of an illustrative curved lenticular display showing how the emission areas at the edges of the display may not be viewable in accordance with an embodiment.

FIG. 7 is a cross-sectional side view of an illustrative lenticular display having convex curvature. In other words, the edges of the display are curved away from the emission direction of the display. The lenticular display of FIG. 7 may use the same lenticular lens film as the display of FIG. 6, meaning that angle 52 in FIG. 7 is the same as angle 52 in FIG. 6. As shown in FIG. 7, the convex curvature of lenticular display 14 causes some of the pixels to fall outside of the viewing cone of the viewer. Similar to FIG. 6, viewing cone 54F corresponds to a viewer looking at display 14 from the front of the display (e.g., at an on-axis direction parallel to the display's surface normal 56 at the center of the display). Viewing cone 54A may correspond to a viewer looking at display 14 in a direction that is angled by 15° relative to the surface normal 56.

As shown by viewing cone 54F, a viewer from the front of the display can properly see a pixel at the center of the display. However, the emission cones of the pixels at the left and right edges of the display are too narrow to overlap with viewing cone 54F. A viewer at the front of the display therefore will not see the pixels at the left and right edges of the display. As shown by viewing cone 54A, a viewer from an off-axis position can properly see pixels at the center of the display and at the right edge of the display. However, the emission cones of the pixels at the left edge of the display do not overlap viewing cone 54A. A viewer at the 15° angle may therefore not properly see pixels on the far edge of the display.

Figure 8:
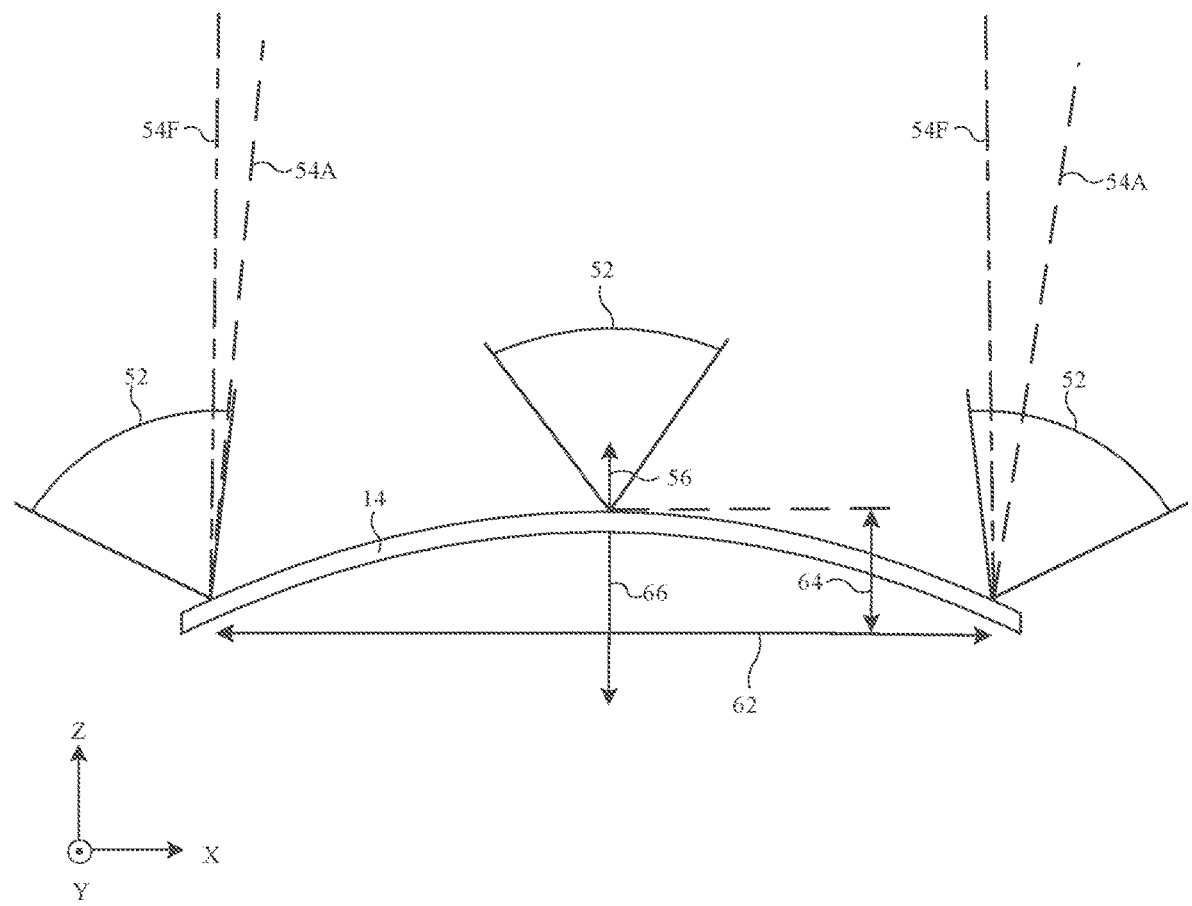
FIG. 8 is a cross-sectional side view of an illustrative curved lenticular display showing how the emission areas of the display may be broadened to allow for convex curvature in the display in accordance with an embodiment.

To enable convex curvature in lenticular displays, the lenticular lens film may be modified to increase the angle of the emission cone of light from the pixels. For example, the lenticular lens film may have lenticular lenses with more curvature. FIG. 8 is a cross-sectional side view of a display of this type. As shown in FIG. 8, the display pixels may have an emission angle 52 that is larger than the emission angle of the display pixels in FIGS. 6 and 7. The emission angle in FIG. 8 may be 60° in one illustrative example (e.g., ±30°). This is in contrast to the emission angle in FIG. 7 which may be 30° in one illustrative example (e.g., 15°).

Similar to FIGS. 6 and 7, viewing cone 54F in FIG. 8 corresponds to a viewer looking at display 14 from the front of the display (e.g., at an on-axis direction parallel to the display's surface normal 56 at the center of the display). Viewing cone 54A may correspond to a viewer looking at display 14 in a direction that is angled by 15° relative to the surface normal 56.

As shown in FIG. 8, from both the front view 54F and angled view 54A, the viewing cone overlaps the emission cone of the display pixels. Therefore, a viewer may properly see the pixels on the left side of the display, the center of the display, and the right side of the display. This may be true across viewing angles from 0° (e.g., parallel to the surface normal 56) to ±15°.

Lenticular display 14 with convex curvature may have a width 62, height 64, and radius of curvature 66. Width 62 may refer to the width of the footprint of display 14 (e.g., the width of the outline of the display when viewed from above, not accounting for the display's curvature). Width 62 may sometimes be referred to as a footprint width. Display 14 may also have a panel width that refers to the width of display 14 before bending occurs. Height 64 may refer to the vertical distance (e.g., along the Z-axis) between the upper-most portion of the upper surface of the display (e.g., the center of the display) and the lower-most portion of the upper surface of the display (e.g., the left and right edges of the display). In FIG. 8, width 62 may be between 100 and 200 millimeters, greater than 60 millimeters, greater than 100 millimeters, greater than 150 millimeters, greater than 200 millimeters, greater than 500 millimeters, greater than 1,000 millimeters, less than 300 millimeters, less than 2 millimeters, between 125 and 175 millimeters etc. Height 64 may be greater than 1 millimeter, greater than 2 millimeters, greater than 4 millimeters, greater than 5 millimeters, greater than 10 millimeters, greater than 10 millimeters, between 5 and 10 millimeters, less than 10 millimeters, between 5 and 7 millimeters, etc. In one illustrative arrangement, width 62 is approximately (e.g., within 10% of) 150 millimeters and height 64 is approximately (e.g., within 10% of) 6 millimeters.

The curvature of the display in FIG. 8 may also be characterized by radius of curvature 66. The radius of curvature refers to the radius of the circular arc that best approximates the curve at that point. Therefore, a large radius of curvature indicates a mild curvature (because the curve develops over a longer distance) whereas a small radius of curvature indicates tight curvature (because the curve develops over a shorter distance). In FIG. 8, the radius of curvature is uniform across the display. The radius of curvature may be approximately (e.g., within 10%) of 400 millimeters. This example is merely illustrative, and the radius of curvature may be lower or higher if desired (e.g., greater than 400 millimeters, greater than 600 millimeters, greater than 800 millimeters, greater than LO millimeters, less than 800 millimeters, less than 500 millimeters, less than 400 millimeters, less than 300 millimeters, less than 200 millimeters, etc.).

In some cases, it may be desirable to form a lenticular display with more curvature than the lenticular display in FIG. 8. For example, a larger degree of curvature may be desired to match the form factor of the electronic device. The radius of curvature may be reduced to increase curvature in the display. However, the pixels may then not be properly viewable (similar to as shown in connection with FIG. 7). In FIG. 8, the emission angle 52 is already increased relative to FIG. 7, yet viewing cone 54A barely overlaps the emission cone 52. Therefore, to enable proper pixel viewing with a higher degree of curvature, the emission angle would have to be increased. However, this may not be possible due to constraints in the lenticular lens film manufacturing process. The emission angle 52 in FIG. 8 may be the maximum possible emission angle for the lenticular lens film. Therefore, the emission angle cannot be increased to accommodate increased convex curvature in the display.

In addition to or instead of modifying the lenticular lens film for increased emission angle, other techniques may be used to enable forming of stereoscopic displays with desired convex curvature. One way to increase the curvature of the display while avoiding visible artifacts is to have non-stereoscopic regions along the edges of the display. The non-stereoscopic regions may be configured to present two-dimensional content instead of three-dimensional content. Accordingly, the viewing angle constraints for the non-stereoscopic regions may be alleviated. This allows for a greater degree of curvature to be used in the display.

Figure 9:
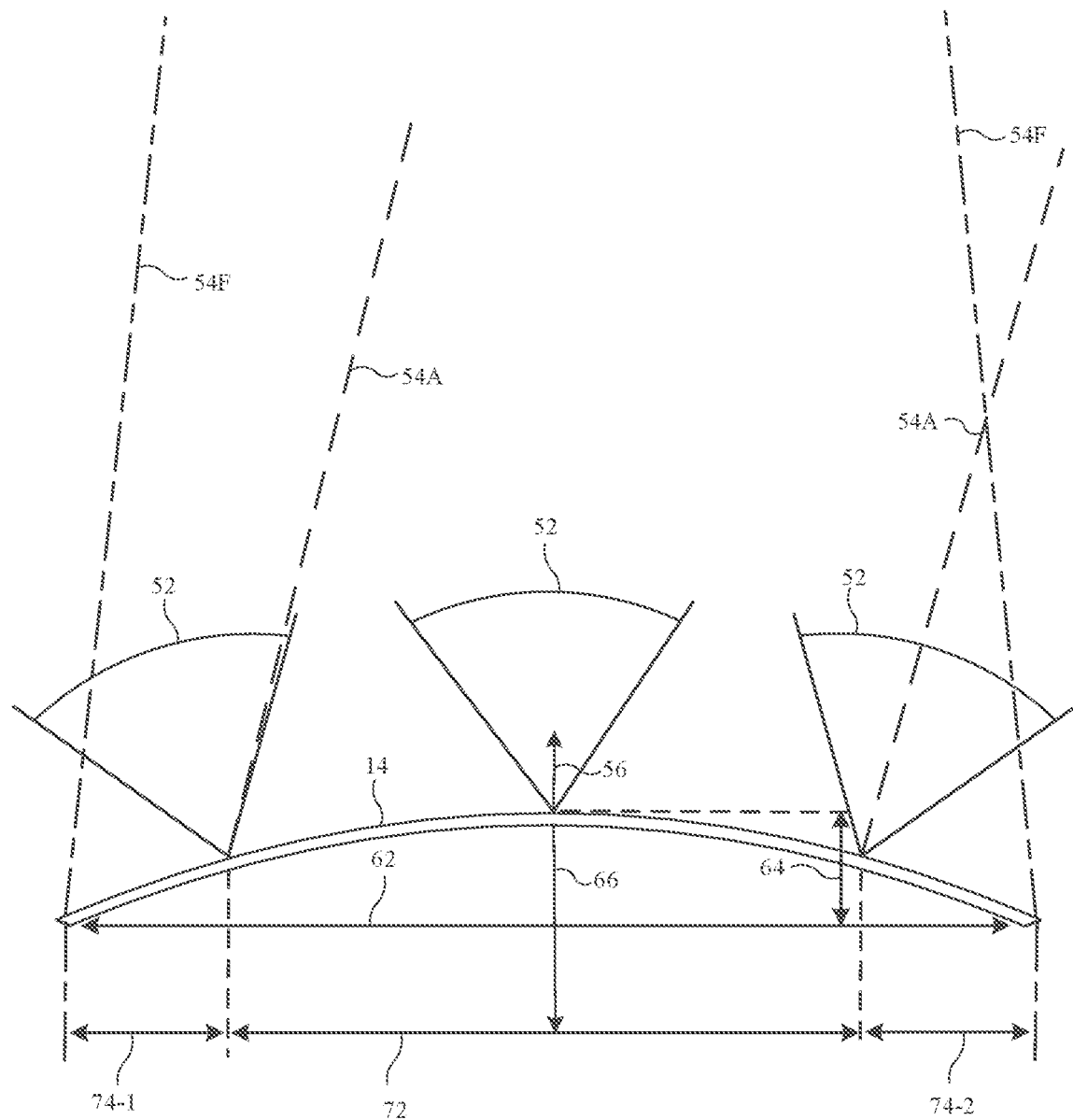
FIG. 9 is a cross-sectional side view of an illustrative curved lenticular display showing how non-stereoscopic regions may be included at the edges of the display to allow for more curvature in the display in accordance with an embodiment.

FIG. 9 is a cross-sectional side view of a lenticular display with non-stereoscopic portions for increased convex curvature. As shown in FIG. 9, the display has a central stereoscopic portion 72. The display also has non-stereoscopic portions 74-1 and 74-2 that are formed around the central stereoscopic portion along the left and right edges of the display, respectively.

In non-stereoscopic display portions 74-1 and 74-2, pixel data may be used such that the same image is provided to both the left and right eye of the user. This prevents the user from perceiving a three-dimensional image in this area. However, the pixels in these regions may be properly viewed from a wide range of viewing angles, not just viewing angles that overlap emission cones 52. This effectively removes any viewing angle constraints for the pixels in non-stereoscopic portions 74-1 and 74-2. The viewing angle constraints may still be present for the pixels in stereoscopic portion 72, but the reduced width of this portion (due to the presence of the non-stereoscopic portions) allows for more aggressive curvature of the display.

As shown in FIG. 9, from both the front view 54F and angled view 54A, the viewing cone overlaps the emission cone of the display pixels. Therefore, a viewer may properly see the pixels on the left side of the stereoscopic portion of the display, the center of the stereoscopic portion of the display, and the right side of the stereoscopic portion of the display. This may be true across viewing angles from 0° (e.g., parallel to the surface normal 56) to +15°. Because the pixels in non-stereoscopic display portions 74-1 and 742 are not constrained to viewing within angle 52, the pixels in non-stereoscopic display portions 74-1 and 74-2 may also be viewable from both the front view 54F and the angled view 54A.

In FIG. 9, width 62 may be the same as the width 62 in FIG. 8. Alternatively, the panel width in FIG. 9 may be the same as the panel width in FIG. 8 and the footprint width 62 in FIG. 9 may be smaller than the footprint width in FIG. 8 due to the increased curvature in FIG. 9. Width 62 in FIG. 9 may be between 100 and 200 millimeters, greater than 60 millimeters, greater than 100 millimeters, greater than 150 millimeters, greater than 200 millimeters, greater than 500 millimeters, greater than 1,000 millimeters, less than 300 millimeters, less than 200 millimeters, between 125 and 175 millimeters etc. Height 64 in FIG. 9 may be greater than height 64 in FIG. 8, due to the increased curvature of the display. Height 64 may be greater than 1 millimeter, greater than 2 millimeters, greater than 4 millimeters, greater than 5 millimeters, greater than 10 millimeters, greater than 15 millimeters, greater than 20 millimeters, greater than 100 millimeters, between 5 and 10 millimeters, between 10 and 15 millimeters, between 11 and 13 millimeters, less than 10 millimeters, etc. In one illustrative arrangement, display 14 in FIG. 9 has a width 62 of approximately (e.g., within 10% of) 150 millimeters and a height 64 of approximately (e.g., within 10% of) 12 millimeters.

The curvature of the display in FIG. 9 may also be characterized by radius of curvature 66. In FIG. 9, the radius of curvature is uniform across the display. The radius of curvature 66 in FIG. 9 is smaller than the radius of curvature 66 in FIG. 8 due to the increased curvature in FIG. 9. The radius of curvature may be approximately (e.g., within 10% of) 290 millimeters. This example is merely illustrative, and the radius of curvature may be lower or higher if desired (e.g., greater than 200 millimeters, greater than 400 millimeters, greater than 6 millimeters, greater than 800 millimeters, greater than 1,000 millimeters, less than 800 millimeters, less than 500 millimeters, less than 400 millimeters, less than 300 millimeters, less than 200 millimeters, between 250 and 350 millimeters, etc.).

Figure 10:
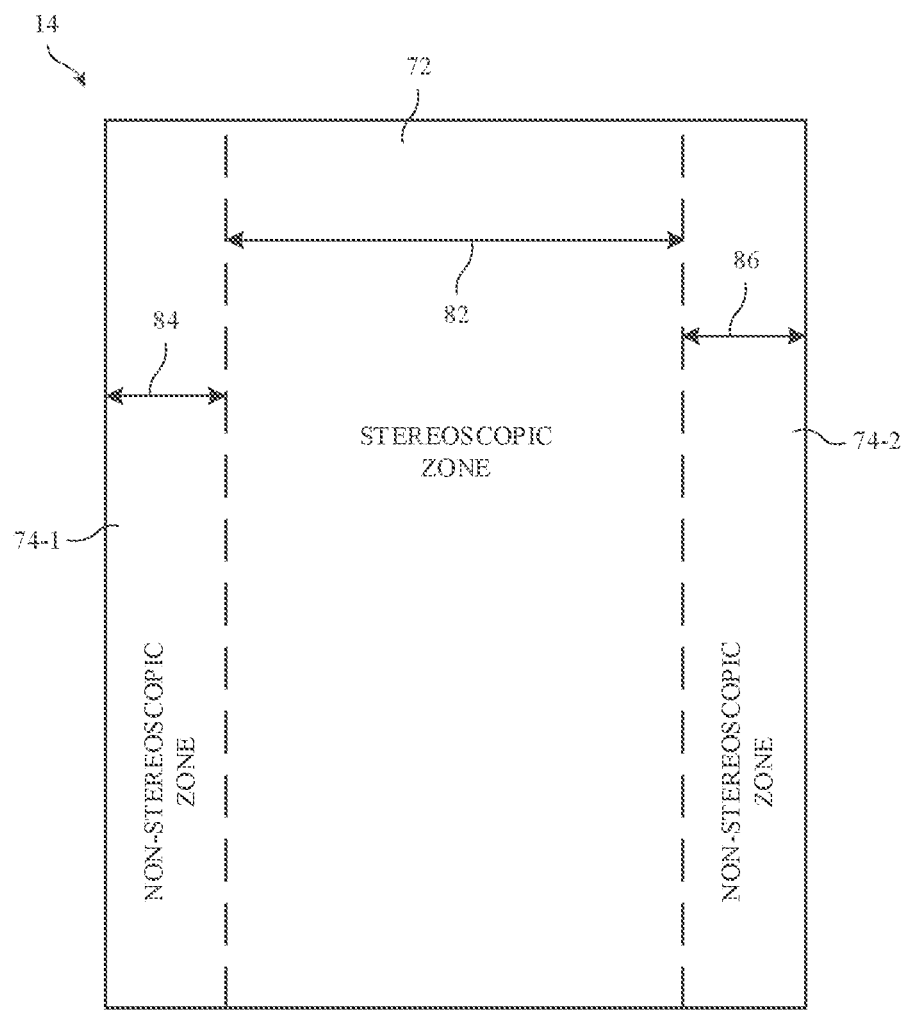
FIG. 10 is a top view of an illustrative curved lenticular display showing how a stereoscopic zone may be interposed between first and second non-stereoscopic zones in accordance with an embodiment.

FIG. 10 is a top view of an illustrative lenticular display with a stereoscopic zone and non-stereoscopic zones. As shown in FIG. 10, the display may have a stereoscopic zone 72 (sometimes referred to as stereoscopic region, stereoscopic portion, three-dimensional portion, central portion, etc.) that is interposed between non-stereoscopic zone 74-1 and non-stereoscopic zone 74-2 (sometimes referred to as non-stereoscopic regions, non-stereoscopic portions, two-dimensional portions, edge portions, etc.). The stereoscopic zone may present three-dimensional content for the viewer whereas the non-stereoscopic zones may present two-dimensional content for the viewer. The presence of the non-stereoscopic zones may enable more convex curvature in the display without disruption to the stereoscopic viewing in the stereoscopic zone.

Each zone of the display may have any desired width. Stereoscopic zone 72 may have a width 82 (either a footprint width or a panel width) that is between 100 and 200 millimeters, greater than 50 millimeters, greater than 75 millimeters greater than 100 millimeters, greater than 150 millimeters, greater than 200 millimeters, greater than 500 millimeters, greater than 1.000 millimeters, less than 300 millimeters, less than 20 millimeters, less than 150 millimeters, between 80 and 150 millimeters, between 100 and 120 millimeters etc. Non-stereoscopic zone 74-1 may have a width 84 (either a footprint width or a panel width) that is greater than 5 millimeters, greater than 10 millimeters, greater than 15 millimeters, greater than 20 millimeters, greater than 50 millimeters, greater than 100 millimeters, greater than 300 millimeters, between 10 and 30 millimeters, between 10 and 60 millimeters, between 15 and 25 millimeters, less than 40 millimeters, etc. Non-stereoscopic zone 74-2 may have a width 86 (either a footprint width or a panel width) that is greater than 5 millimeters, greater than 10 millimeters, greater than 15 millimeters, greater than 20 millimeters, greater than 50 millimeters, greater than 100 millimeters, greater than 300 millimeters, between 10 and 30 millimeters, between 10 and 60 millimeters, between 15 and 25 millimeters, less than 40 millimeters, etc.

Decreasing the width of stereoscopic zone 72 (and accordingly, increasing the width of the non-stereoscopic zones) may increase the maximum allowable curvature of the display. However, decreasing the width of the stereoscopic portion reduces the amount of three-dimensional content that can be displayed using the lenticular display. These factors may be balanced based on the design requirements for a particular lenticular display.

Figure 11:
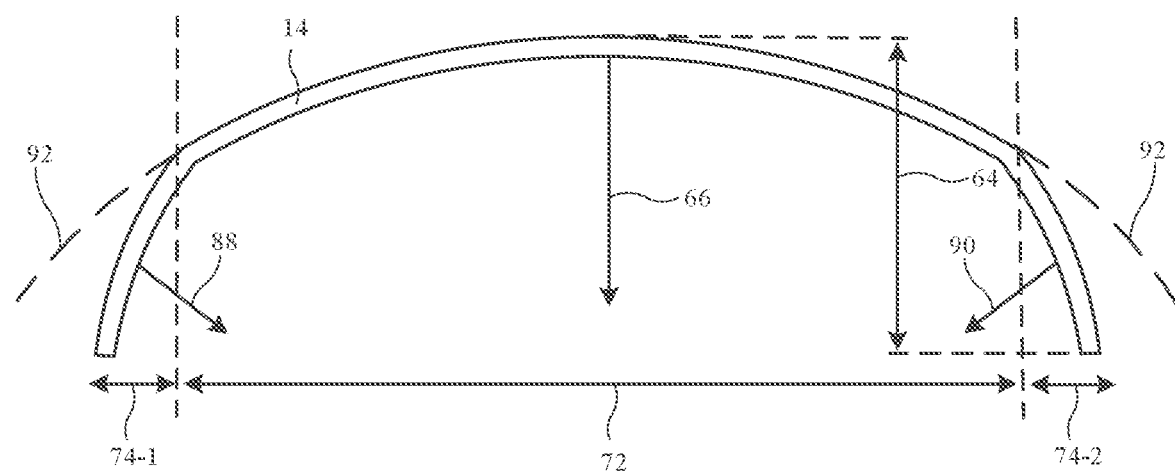
FIG. 11 is a cross-sectional side view of an illustrative curved lenticular display having a different radius of curvature in the non-stereoscopic zones than in the stereoscopic zones in accordance with an embodiment.

FIGS. 7-9 have shown examples of displays with a uniform radius of curvature across the display. These examples are merely illustrative. Some lenticular displays may have varying curvature across the display. FIG. 1 is a cross-sectional side view of a lenticular display with two different radii of curvature. As shown in FIG. 11, stereoscopic portion 72 may have a first radius of curvature 66. The display may also include non-stereoscopic portions 74-1 and 74-2. Because the non-stereoscopic portions are not used to present three-dimensional content, these portions may be less constrained in their radius of curvature. Therefore, if useful to fit a desired form factor, the non-stereoscopic portions of the display may have a higher degree of curvature than the stereoscopic portions of the display. FIG. 1 shows dashed lines 92 to indicate the position of the non-stereoscopic display portions if the curvature remained uniform across the entire display. Instead, the radii of curvature 88 and 90 are smaller than the radius of curvature 66. The display is therefore more curved in edge portions 74-1 and 74-2 than in central portion 72.

Having more curvature in non-stereoscopic portions 74-1 and 74-2 allows for the display height 64 in FIG. 11 to be larger than in FIG. 9 (when uniform curvature is used). Height 64 in FIG. 1 may be greater than 1 millimeter, greater than 2 millimeters, greater than 4 millimeters, greater than 5 millimeters, greater than 10 millimeters, greater than 12 millimeters, greater than 15 millimeters, greater than 20 millimeters, greater than 50 millimeters, greater than 100 millimeters, between 10 and 15 millimeters, between 10 and 20 millimeters, between 8 and 40 millimeters, less than 40 millimeters, etc.

The radius of curvature 66 may be approximately (e.g., within 10%) of 290 millimeters. This example is merely illustrative, and radius of curvature 66 may be lower or higher if desired (e.g., greater than 200 millimeters, greater than 400 millimeters, greater than 600 millimeters, greater than 800 millimeters, greater than 1,000 millimeters, less than 8 millimeters, less than 500 millimeters, less than 400 millimeters, less than 300 millimeters, less than 200 millimeters, between 250 and 350 millimeters, etc.). Radius of curvature 88 may be less than 290 millimeters, less than 250 millimeters, less than 200 millimeters, greater than 200 millimeters, greater than 250 millimeters, greater than 500 millimeters, greater than 10 millimeters, less than 800 millimeters, less than 500 millimeters, less than 400 millimeters, less than 200 millimeters, between 150 and 300 millimeters, etc. Radius of curvature 90 may be less than 290 millimeters, less than 250 millimeters, less than 200 millimeters, greater than 2 millimeters, greater than 250 millimeters, greater than 500 millimeters, greater than 1,000 millimeters, less than 800 millimeters, less than 500 millimeters, less than 400 millimeters, less than 200 millimeters, between 150 and 300 millimeters, etc. Radius of curvature 88 may the same or may be different than radius of curvature 90.

If desired, the radius of curvature may vary within stereoscopic region 72. In general, the radius of curvature of any portion of display 14 may be selected based on the particular design and form factor of the lenticular display.

Figure 12:
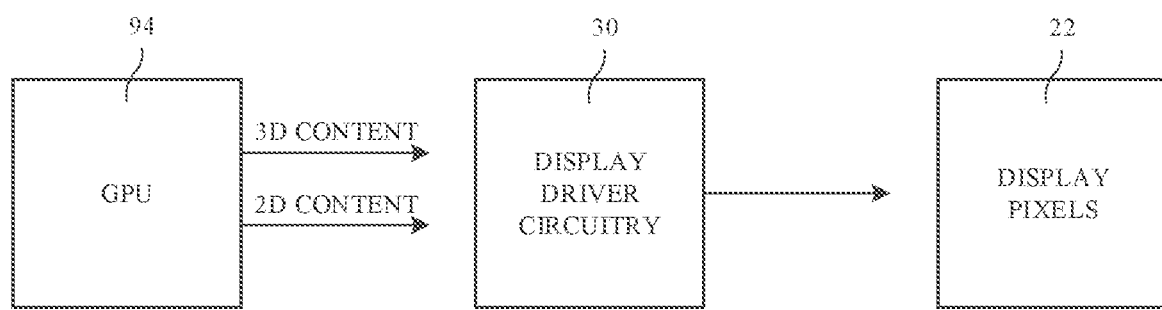
FIG. 12 is a schematic diagram of an illustrative electronic device that uses both two-dimensional content for non-stereoscopic display zones and three-dimensional content for stereoscopic display zones in accordance with an embodiment.

FIG. 12 is a schematic diagram of an illustrative electronic device with a display having both stereoscopic and non-stereoscopic portions. Electronic device 10 may include a graphics processing unit 94 that provides image data (e.g., brightness values to be used for each pixel) to display driver circuitry 30. Display driver circuitry 30 may supply the image data to data lines D of the display. The images corresponding to the image data are then displayed using display pixels 22 of lenticular display 14.

As shown in FIG. 12, graphics processing unit 94 (GPU) may provide both three-dimensional content (e.g., stereoscopic image content) and two-dimensional content (e.g., non-stereoscopic image content) to the display driver circuitry 30. The three-dimensional content may be configured to be displayed in the stereoscopic portion of the display whereas the two-dimensional content may be configured to be displayed on the non-stereoscopic portions of the display. The two-dimensional content may include duplicate values for some of the display pixels to ensure that the pixel appears the same regardless of viewing angle. In other words, the pixels are provided with image data such that the same image is provided to the left and right eye of the user. This prevents a three-dimensional image from being perceived by the user, but avoids errors that may be caused due to having a lenticular display with convex curvature.

The example in FIG. 12 of a graphics processing unit 94 providing the image data to display driver circuitry 30 is merely illustrative. In general, any desired circuitry or display component may be used to provide the image data to display driver circuitry 30.

Figure 13:
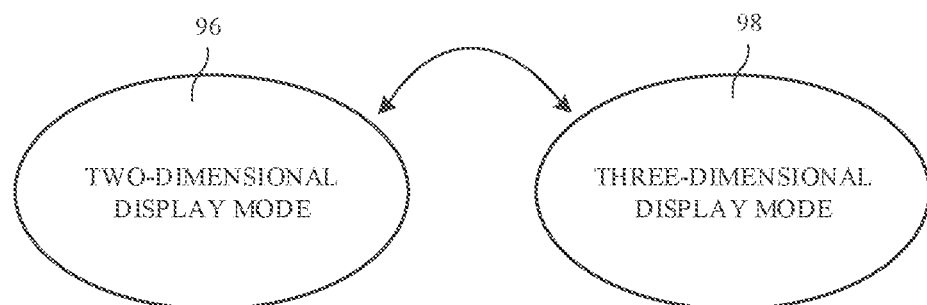
FIG. 13 is a state diagram showing how the display may be operated in a two-dimensional display mode and a three-dimensional display mode in accordance with an embodiment.

In some cases, display 14 may be operable in multiple modes. FIG. 13 is a state diagram showing illustrative modes of operation for display 14. As shown, the display may operate in a two-dimensional display mode 96 and a three-dimensional display mode 98. In the two-dimensional display mode 96, the entire display may be treated as non-stereoscopic. The pixel data may be selected such that the displayed image appears the same in both eyes, preventing the stereoscopic effect that results in perception of a three-dimensional image. In three-dimensional display mode 98, three-dimensional image data may be provided to the stereoscopic portion(s) of the display. For example, stereoscopic portion 72 may be used to present three-dimensional content. In the three-dimensional display mode, non-stereoscopic display portions such as non-stereoscopic display portions 74-1 and 74-2 in FIG. 13 may still present two-dimensional content in order to enable increased curvature of the lenticular display.

Figure 14A:
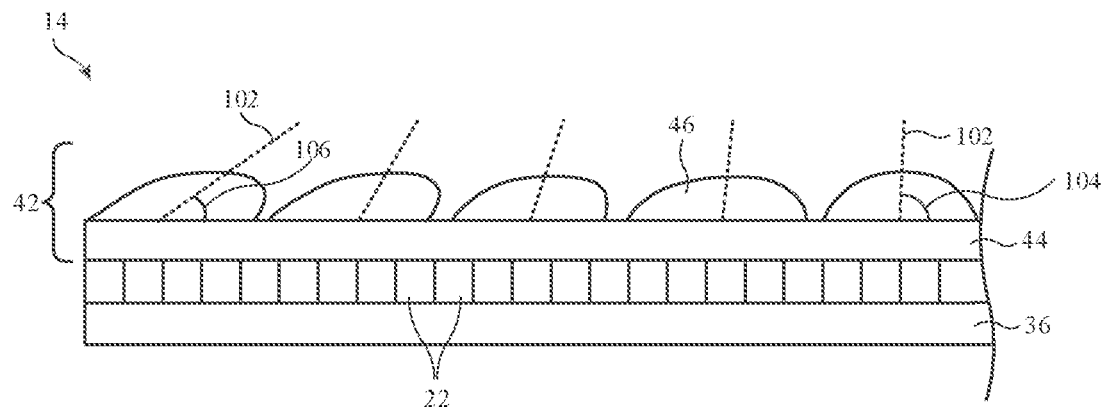
FIG. 14A is a cross-sectional side view of an illustrative display with lenticular lenses that have a progressively changing shape to control emission of light at the curved edges of the display in accordance with an embodiment.
Figure 14B:
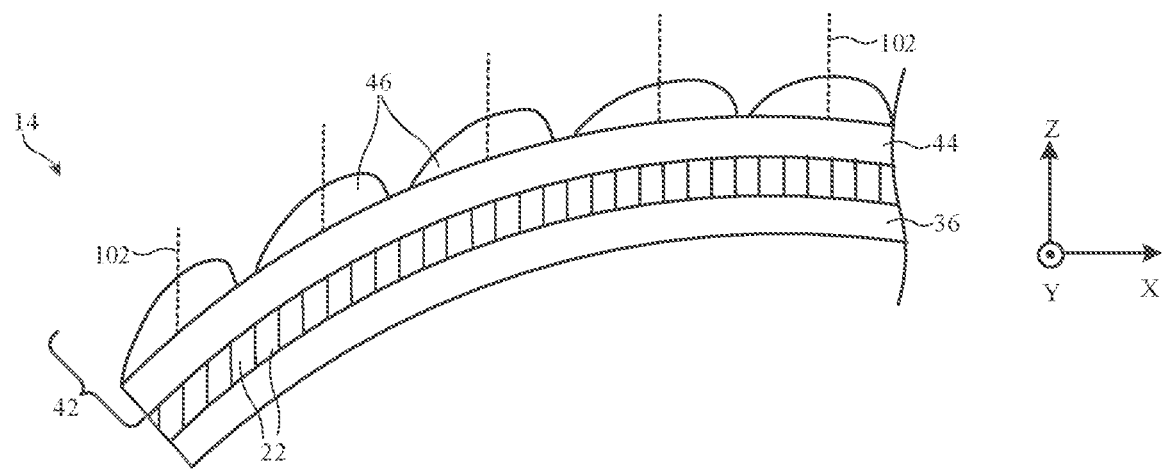
FIG. 14B is a cross-sectional side view of the illustrative display of FIG. 14A after the display has been curved in accordance with an embodiment.

FIGS. 14A and 14B show another technique for enabling increased convex curvature in lenticular displays. In particular, the lenticular lenses may have a varying shape across the display to direct the light in a desired direction. FIG. 14A shows a lenticular display with shifted lenticular lenses before the lenticular display is curved. As shown in FIG. 14A, lenticular display 14 has display pixels 22 on a substrate 36, similar to as discussed previously. Lenticular lens film 42 includes lenticular lenses 46 on a base film 44. Each lenticular lens may have an axis 102 that corresponds to the primary emission direction of light that is redirected by the lens (e.g., the direction of a chief ray associated with the lenticular lens). Said another way, light may be redirected by the lenticular lens to have an emission cone with a center defined by axis 102. The shape of the lens may be shifted in order to control the direction of axis 102. To allow for increased convex curvature in the display, the axis of each lenticular lens may vary depending on the position of the lenticular lens within the display.

As shown in FIG. 14A, the angle of axis 102 relative to the planar upper surface of base film 44 varies among the lenticular lenses. A lenticular lens at the center of the display may have an axis at an angle 104 relative to the planar upper surface of base film 44. Angle 104 may be 90°, indicating how the light from the lenticular lens may be emitted in a direction orthogonal to the upper surface of the base film. However, as the lenticular lenses move closer to the edge of the display, the angle of axis 102 may decrease. A lenticular lens at the edge of the display may have an axis 102 at an angle 106 relative to the upper surface of base film 44. Angle 106 may be less than 90°, less than 85°, less than 80°, less than 70°, less than 60°, less than 50°, less than 45°, more than 45°, more than 70°, between 45° and 85°, etc.

The angle of each lenticular lens axis relative to the base film may progressively decrease from a maximum at the center of the display (e.g., 90°) to a minimum at the edge of the display. The angle of each axis may decrease continuously and monotonically, or may decrease according to a step function. There may be at least two different angles present in the display, at least three different angles present in the display, at least five different angles present in the display, at least ten different angles present in the display, etc. The lens shape may be shifted (e.g., distorted, made asymmetric, etc.) in order to control the axis of the lens. Accordingly, the lens shape may progressively shift from a symmetric shape at the center of the display to a maximally shifted shape at the edge of the display. The amount of shift in each lenticular lens shape may increase continuously and monotonically from the center to the edge or may increase according to a step function. There may be at least two different lens shapes present in the display, at least three different lens shapes present in the display, at least five different lens shapes present in the display, at least ten different lens shapes present in the display, etc.

The lenticular lens shapes may be shifted such that light from the display is emitted in an on-axis direction after the display is curved. FIG. 14B shows a cross-sectional side view of the lenticular display in a curved state. As shown, the shift of the lens results in the axes 102 being parallel to the Z-axis, regardless of whether the lens is in the center of the display or the edge of the display. Therefore, the shifted shapes of lenticular lenses 46 in FIGS. 14A and 14B can be used to redirect the light in the Z-direction. This may enable more curvature in the display, as edge pixels may still be able to present three-dimensional content despite the curvature due to the shifted lenticular lenses. The example in FIG. 14B where each axis 102 is parallel to the Z-axis is merely illustrative. In general, lenticular lenses 46 may be shifted such that the axes 102 are closer to being parallel to the Z-axis, but the axes may still not all be parallel with the Z-axis.

Although only half of the display is shown in FIGS. 14A and 14B, it should be understood that this technique may be used for both halves of the lenticular display. On both halves of the display, one or more lenticular lenses may have shapes that are distorted to cause light to be redirected more towards the center of the display (in a planar configuration) and therefore closer to the Z-axis (in a bent configuration).

Figure 15:
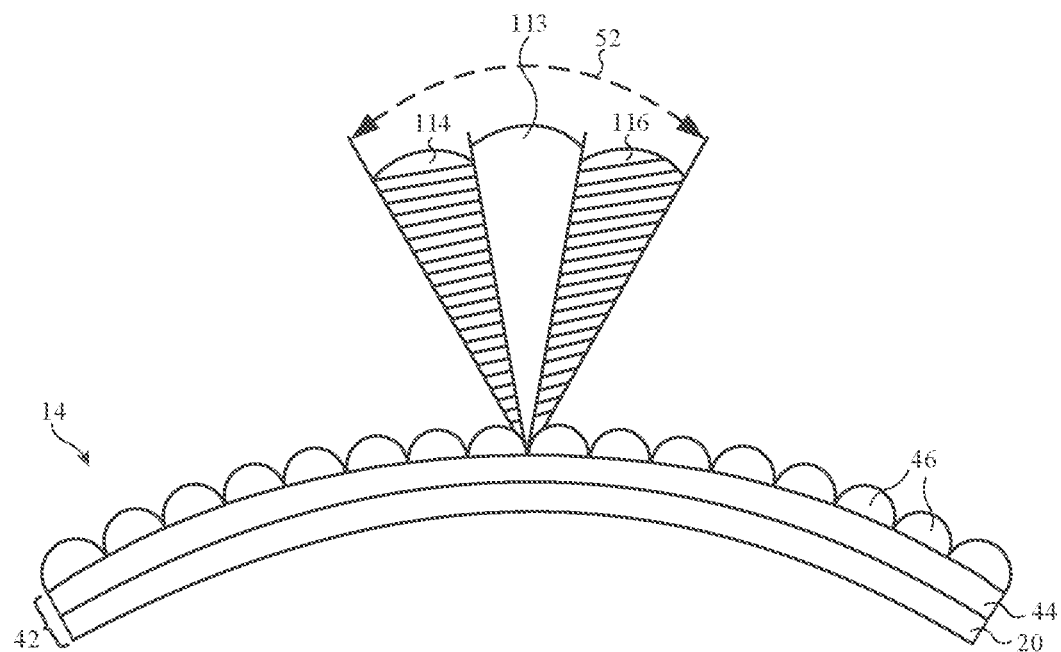
FIG. 15 is a cross-sectional side view of an illustrative curved lenticular display showing how some off-axis light may contribute to crosstalk in accordance with an embodiment.

Another potential problem that may affect lenticular displays is errors due to crosstalk. FIG. 15 is a cross-sectional side view of a lenticular display illustrating this issue. As shown in FIG. 15, pixels in the display may emit light over an emission angle 52 (sometimes referred to as an emission cone) that is controlled at least in par by the lenticular lens film of the display. The optimal viewing angle of the display may only correspond to emission area 113. However, the light emitted in regions 114 and 116 may still be viewable by viewers at large viewing angles outside of the normal field of view. The light emitted in regions 114 and 116 may cause image inversion or repeated pixels for these viewers. These type of noticeable defects in the displayed image are undesirable.

Figure 16:
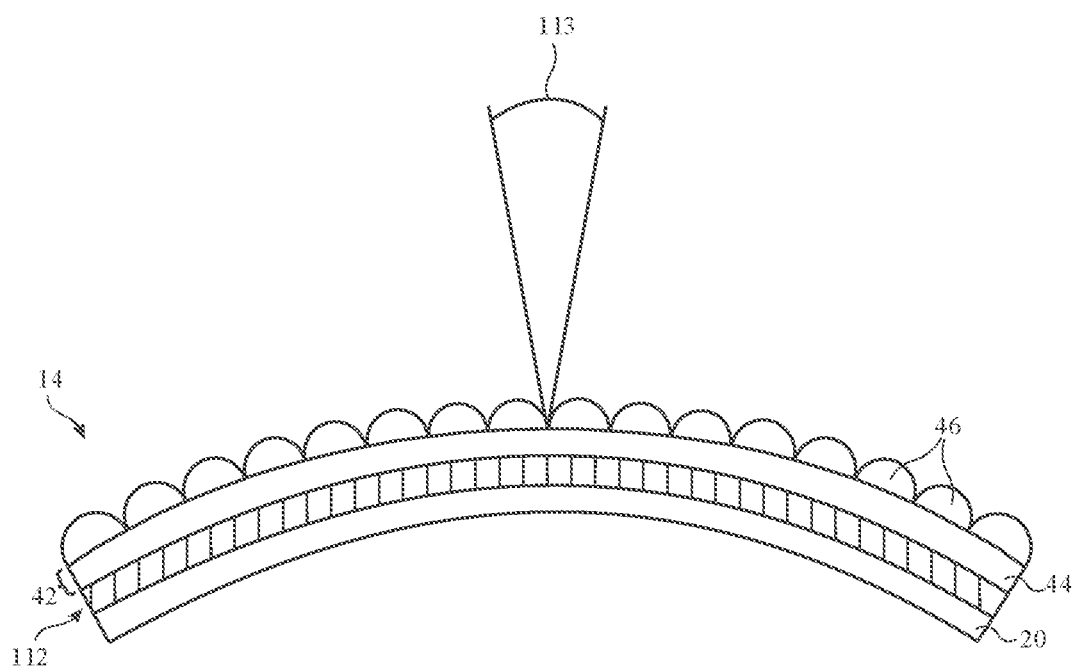
FIG. 16 is a cross-sectional side view of an illustrative curved lenticular display having a louver film to block off-axis light that contributes to crosstalk in accordance with an embodiment.

To block crosstalk that causes noticeable defects in a lenticular display, a louver film may be incorporated into the display. FIG. 16 is a cross-sectional side view of a lenticular display with a louver film. As shown in FIG. 16, louver film 112 may be interposed between display panel 20 and lenticular lens film 42. The louver film may block light past certain viewing angles. This ensures that light corresponding to the optimal viewing angle is still emitted from the display (as shown by emission area 113 in FIG. 16). However, light outside of this area is blocked by louver film 112. Accordingly, the light from regions 114 and 116 in FIG. 15 is not present in FIG. 16. Outside of the optimal field of view, the display pixels will simply appear dark instead of presenting a repeated or incorrect image to the viewer.

Figure 17:
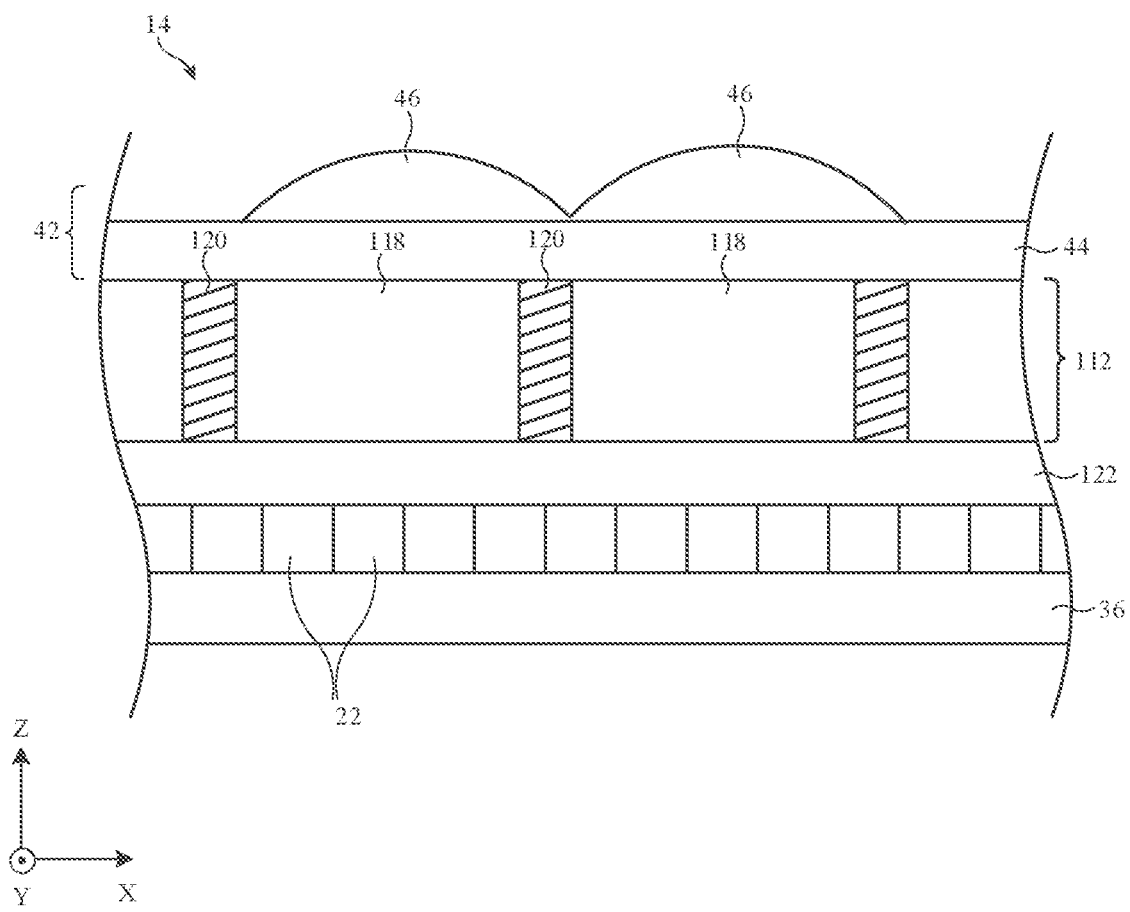
FIG. 17 is a cross-sectional side view of an illustrative lenticular display having a louver film below a lenticular lens film in accordance with an embodiment.

FIG. 17 is a cross-sectional side view of a lenticular display showing a detailed view of a louver film included in the lenticular display. Display 14 includes pixels 22 on substrate 36. Substrate 36 may be formed from glass, metal, plastic, ceramic, or other substrate materials and pixels 22 may be organic light-emitting diode pixels, liquid crystal display pixels, or any other desired type of pixels. Lenticular lens film 42 may be formed over the display pixels. Lenticular lens film 42 includes lenses 46 and a base film portion 44.

The display of FIG. 17 also includes a polarizer 122 formed over display pixels 22. Polarizer 122 may be a linear polarizer (e.g., formed from layers of polyvinyl alcohol (PVA) and tri-acetate cellulose (TAC) or formed from other desired materials). Louver film 112 is interposed between polarizer 122 and lenticular lens film 42. The louver film includes both transparent portions 118 and opaque portions 120. The transparent portions of the louver film may bet formed from a polymer material such as polycarbonate (PC), poly(methyl methacrylate) (PMMA), polyethylene terephthalate (PET), etc. The transparent portions of the louver film may be formed from other materials such as glass if desired. The transparent portions of the louver film may transmit more than 90% of light, more than 95% of light, more than 99% of light, etc.

Opaque portions 120 of the louver film may be formed from an opaque material. For example, the opaque portions may transmit less than 50% of light, less than 40% of light, less than 30% of light, less than 20% of light, less than 10% of light, less than 5% of light, less than 1% of light, etc. The opaque portions may be formed from an opaque polymer material or an opaque material of another type. The opaque portions may extend from an upper surface of the louver film to a lower surface of the louver film. Opaque portions 120 may sometimes be referred to as opaque walls. The opaque portions may be elongated parallel to the Y-axis, similar to the pattern for the lenticular lenses shown in FIG. 5. Each opaque portion may extend in the Y-direction across the entire display.

Due to the presence of opaque portions 120, the angle of light emitted through transparent portions 118 is limited. The angle of emission through the louver film may be less than ±10°, less than +150 less than ±20°, less than +30°, less than ±40°, between ±10° and 30°, between ±10° and ±20°, etc. Because louver film 112 reduces the angle-of-emission and accordingly the viewing angle of the display, louver film 112 may sometimes be referred to as an angle-of-emission reduction layer 112, a viewing angle reduction layer 112, an emission angle reduction angle 112, etc. The louver film may also be referred to as privacy film 12.

Figure 18:
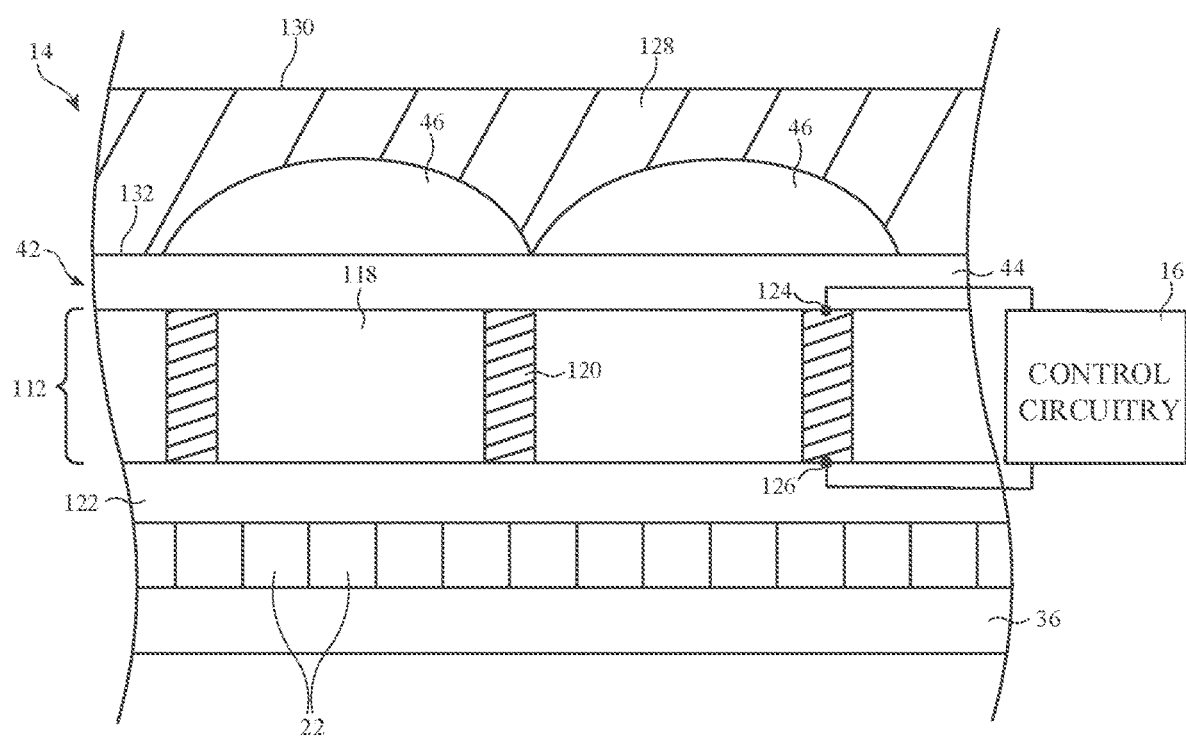
FIG. 18 is a cross-sectional side view of an illustrative lenticular display having a louver film with selectively opaque portions below a lenticular lens film that is covered by a low-index film in accordance with an embodiment.

As shown in FIG. 18, in some cases an additional film may be formed over lenticular lens film 42. Film 128 may conform to the upper surface of lenticular lens film 42. The film may have a smooth upper surface 130 and curved lower surface 132 that directly contacts the upper surface of lens film 42. Forming film 128 over the lens film may provide a smooth upper surface (instead of the non-uniform upper surface of lens film 42), which may provide manufacturing benefits. Covering lens film 42 with film 128 may also protect lens film 42 from damage.

Film 128 may be formed from a transparent material (e.g., a polymer material) having a low index-of-refraction. For example, the index-of-refraction of film 128 may be less than 1.4, less than 1.3, less than 1.2, less than 1.1, etc. Forming film 128 from a low-index material may improve the lens power of lenticular lenses 46 relative to arrangements where a higher-index film is used. Film 128 may sometimes be referred to as a low-index film, protective film, planarization film, low-index layer, protective layer, or planarization layer.

If desired, opaque portions 120 may be selectively opaque. For example, the opaque portions 120 may be switched between a transparent state and an opaque state. The opaque portions may only have two states (e.g., fully transparent and fully opaque) or may have additional states between the two extremes if desired. To switch the transparency of selectively opaque portions 120, control circuitry 16 may apply signals to contact 124 and/or contact 126. In one example, opaque portions 120 may be formed from a liquid crystal material. Control circuitry 16 may apply different voltages to electrodes on either side of the opaque portion (e.g., at contacts 124 and 126) to control the transparency of the opaque portions. In another example, the opaque portions may include electronic ink (e.g., negatively and positively charged black and white particles that are suspended in a clear fluid). Control circuitry may apply signals to contact 124 and/or contact 126 to change the opacity of selectively opaque portion 120 to control the emission angle of the display.

Control circuitry 16 may control all of the opaque portions in the display universally or may have per-opaque-portion control. In some cases, control circuitry 16 may control some selectively opaque portions to be transparent and some selectively opaque portions to be opaque at the same time. In one example, control circuitry 16 may control the opacity of the selectively opaque portions based on information from eye and/or head tracking system. For example, based on the user's head and/or eye position, the control circuitry may make some of the portions 120 opaque to block cross-talk.

Figure 19:
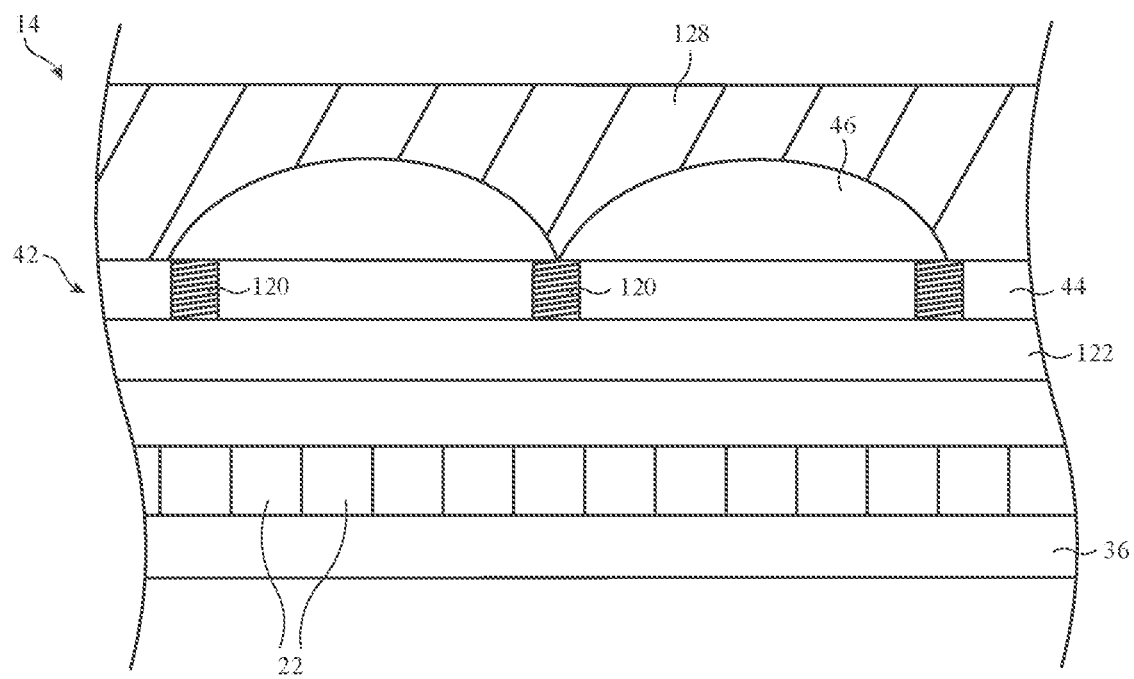
FIG. 19 is a cross-sectional side view of an illustrative lenticular display having opaque portions incorporated into a base portion in accordance with an embodiment.

The example in FIGS. 17 and 18 of having louver film 112 formed separately from lenticular lens film 42 is merely illustrative. As shown in FIG. 19, in one possible embodiment the opaque portions of the louver film may be incorporated directly into the base portion of the lenticular lens film. Said another way, the louver film may serve as the base film for the lenticular lenses. As shown in FIG. 19, base film 44 for lenticular lens film 42 includes opaque portions 120. The opaque portions 120 may be static or may optionally be selectively opaque portions as shown in FIG. 18. The opaque portions 120 in FIG. 19 may extend from an upper surface of the base film to a lower surface of the base film. Opaque portions 120 may sometimes be referred to as opaque walls. Due to the presence of opaque portions 120, the angle of light emitted through the display is limited. The angle of emission through the louver film may be less than +10° less than +15°, less than +20°, less than ±10°, less than +40°, between 10° and ±30°, between ±10° and ±20°, etc.

In FIG. 19, protective film 128 is shown as being formed over lenticular lens film 42. This example is merely illustrative and the protective film may be omitted if desired. Additionally, FIGS. 16-19 have shown illustrative lenticular display arrangements where a louver film is formed below the lenticular lens film. In other words, the light from the display pixels reaches the opaque portions 120 before reaching lenticular lenses 46. However, the order of these components may be reversed if desired.

Figure 20:
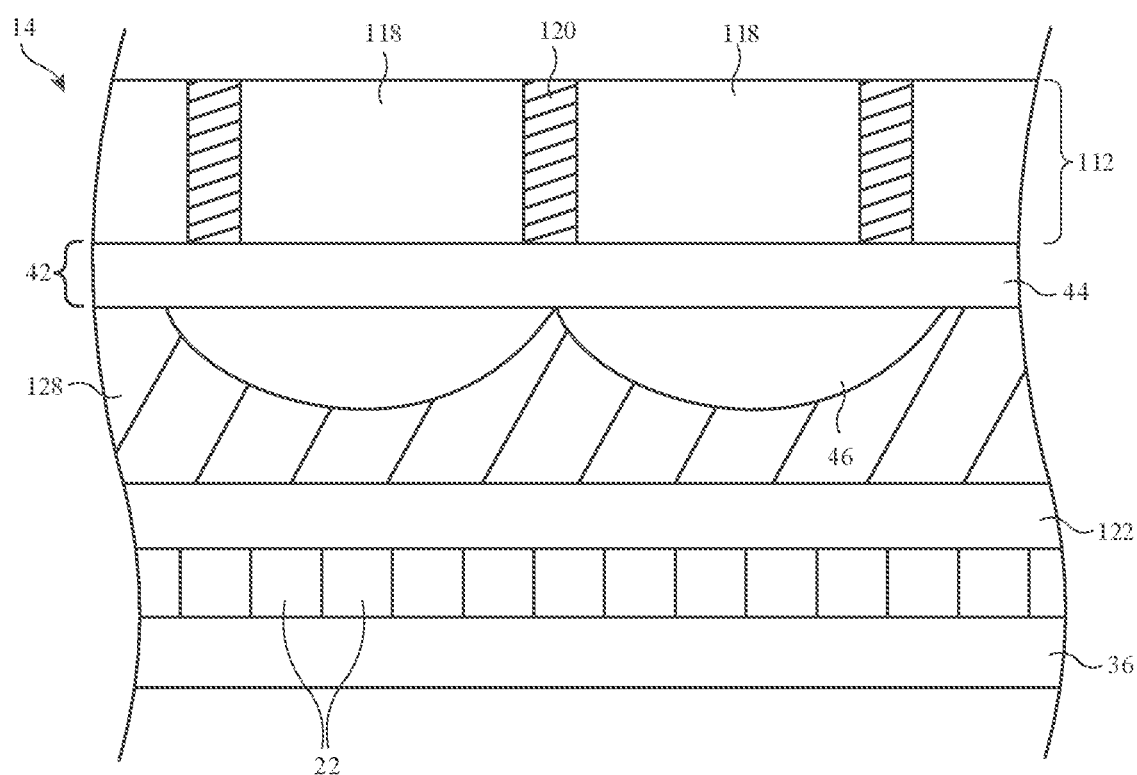
FIG. 20 is a cross-sectional side view of an illustrative lenticular display having a louver film above a lenticular lens film in accordance with an embodiment.

FIG. 20 is a cross-sectional side view of an illustrative display having lenticular lenses interposed between the display pixels and a louver film. As shown in FIG. 20, display pixels 22 may be formed on substrate 36 and polarizer 122 may be formed over display pixels 22 (similar to as in FIGS. 17-19). However, lenticular lens film 42 is interposed between louver film 112 and polarizer 122. Forming the louver film above the lenticular lens film may desirably reduce specular reflections off of the upper surface of the display. The lenticular lens film has a base portion 44 with lenticular lenses 46. However, the lenticular lenses have convex curvature that extends towards the display pixels instead of away from the display pixels. A low-index film 128 is interposed between lenticular lens film 42 and display pixels 22. The low-index film may form a smooth surface that can be better adhered to polarizer 122.

Louver film 112 with transparent portions 118 and opaque portions 120 may be formed over lenticular lens film 42. The louver film operates as previously described, limiting the angle of light that may be emitted from the display. The angle of emission through the louver film may be less than ±10°, less than ±15°less than ±20°, less than ±30, less than 40°, between ±10° and ±30°, between ±10° and ±20°, etc.

In FIG. 20, the opaque portions of the louver film may be incorporated into base film 44 of the lenticular lens film instead of having separately formed lenticular lens and louver films (similar to as shown in FIG. 19). Additionally, opaque portions 120 in FIG. 20 may be selectively opaque as shown in connection with FIG. 18. In FIGS. 17-20, polarization layer 122 may optionally be omitted if desired. In FIGS. 17-20, although a planar portion of the lenticular display is shown, it should be understood that the lenticular display (and all of its components in each cross-section) may have convex curvature (as in FIG. 16) or may be entirely planar.

Figure 21:
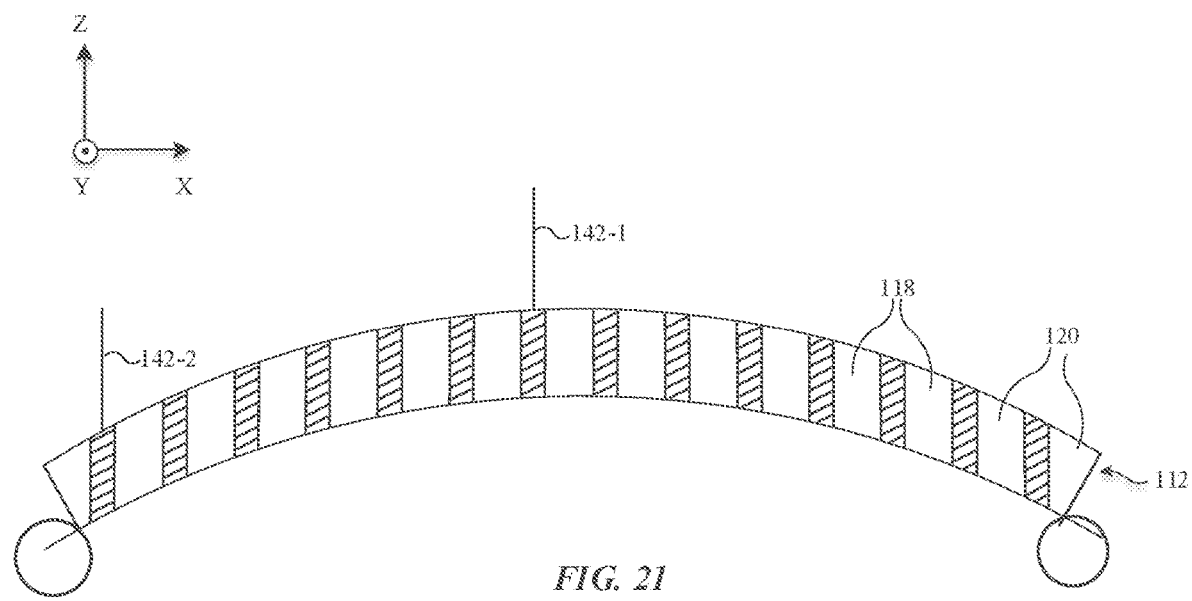
FIG. 21 is a cross-sectional side view of an illustrative louver film that may be incorporated into a curved lenticular display showing how the axes of the opaque portions of the louver film may be selected to be parallel after the louver film is curved in accordance with an embodiment.

As shown in FIG. 21, the opaque portions of the louver film may be angled to ultimately be parallel after the louver film is curved. The opaque portions may be elongated portions that each extend along a respective axis 142. In the center of the curved louver film, axis 142-1 may be perpendicular to the upper and lower surfaces of the louver film (and other layers in the display stack). At the edge of the curved louver film, axis 142-2 may be angled relative to the upper (and lower) surface of the louver film. Axis 142-2 may be at an angle relative to the upper surface of the louver film that is less than 90°, less than 85°, less than 80°, less than 70°, less than 60°, less than 50°, less than 45, more than 45°, more than 70° between 450 and 85°, etc. Axis 142-2 may be angled such that the axis is parallel to the Z-axis.

The angle of each axis may progressively decrease from a maximum at the center of the display (e.g., 90°) to a minimum at each edge of the display. Accordingly, all of the axes 142 for the opaque portions in the louver film may be parallel (or close to parallel). In other words, the axes are angled to account for the curvature of the film. The angle of each axis may decrease continuously and monotonically from the center to the edge of the display, or may decrease according to a step function.

This example is merely illustrative. In other arrangements, the axes may not all be parallel. Any desired pattern of axes may be used to control the pattern of light emitted through the louver film.

The parallel opaque portions of the curved film of FIG. 21 may be applied to the louver film regardless of the rest of the display stack-up. For example, the opaque portions of FIG. 17 may be angled as in FIG. 21 when the display is curved, the opaque portions of FIG. 18 may be angled as in FIG. 21 when the display is curved, the opaque portions of FIG. 19 may be angled as in FIG. 21 when the display is curved, and the opaque portions of FIG. 20 may be angled as in FIG. 21 when the display is curved.

Additionally, a lenticular display having a louver film may have non-stereoscopic regions (as in FIGS. 9 and 10), may have non-uniform radius of curvature across the display (as in FIG. 11), and/or may have lenticular lenses with shifted axes (as in FIGS. 14A and 14B).

Figure 22A:
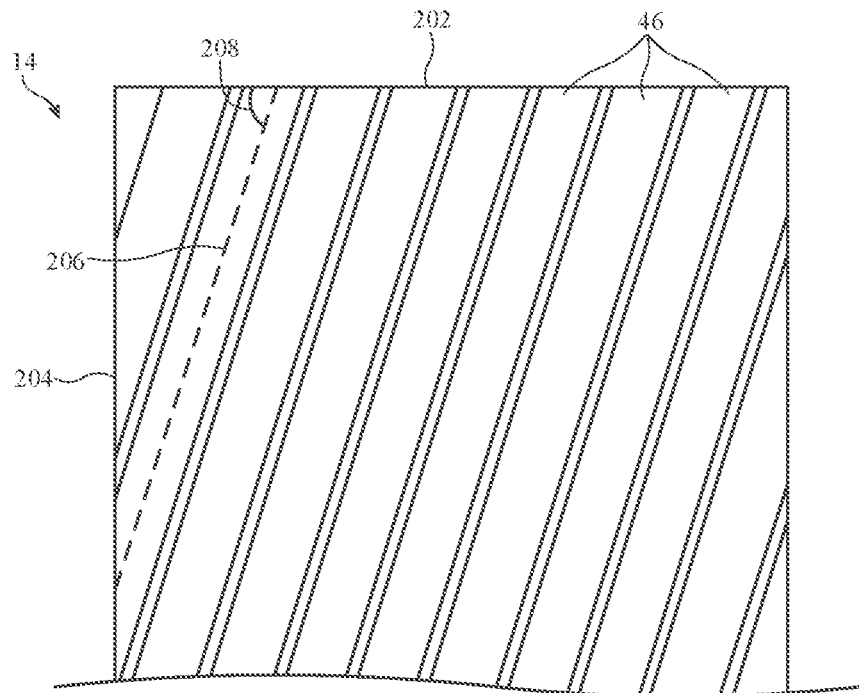
FIGS. 22A and 22B are top views of an illustrative display showing how diagonally oriented lenticular lenses may be formed over a vertical pixel pattern in accordance with an embodiment.
Figure 22B:
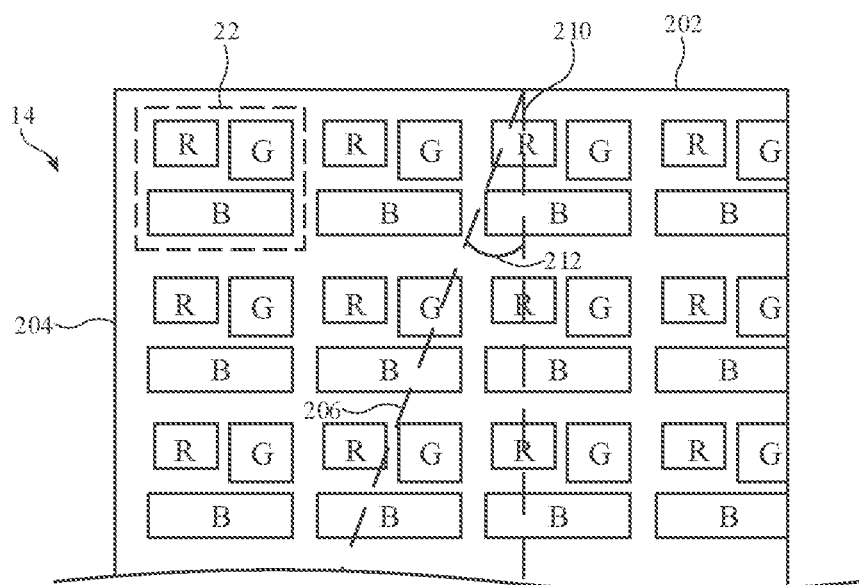

FIGS. 22A and 22B are top views of an illustrative display showing how the lenticular lenses may be at an angle relative to the pixel array. As shown in FIG. 22A, the display may include a lenticular lens film with lenticular lenses 46. The display may have a rectangular periphery with first and second (e.g., upper and lower) opposing edges as well as third and fourth (e.g., left and right) opposing edges. FIG. 22A shows upper edge 202 and side edge 204 (e.g., a left edge). Upper edge 202 and 204 may be orthogonal, as shown in FIG. 22A. The active area of the display and a substrate for the display may have corresponding upper, lower, left, and right edges. The example in FIG. 22A of the upper edge 202 being orthogonal to left edge 204 is merely illustrative. If desired, there may be a rounded corner between the adjacent edges in the display. The display may also include interruptions such as notches or holes in the active area.

Each lenticular lens 46 in the display may extend along a corresponding longitudinal axis 206 (shown in FIG. 22A). In other words, the lenticular lens may have a width, a length, and a height. The length may be greater than the width and height (e.g., by a factor of more than 10, more than 100, more than 1,000, etc.) and the longitudinal axis may extend parallel to the length of the lenticular lens.

As shown in FIG. 22A, the lenticular lenses may be at an angle 208 relative to the upper edge 202 of the display. In this case, angle 208 is less than 90°. The lenticular lenses may be referred to as being angled relative to the display. Angle 208 (e.g., the lower of the two supplementary angles that may be measured between axis 206 and upper edge 202) may be any desired angle (e.g., less than 90°, less than 85°, less than 80° less than 70°, less than 60°, between 60 and 90°, between 60 and 80°, between 65° and 80°, between 65° and 75° etc.). The lenticular lenses may also be at an angle relative to the pixel array.

FIG. 22B is a top view of an illustrative pixel array that is covered by lenticular lenses 46 from FIG. 22A. As shown in FIG. 22B, each pixel 22 may include a red sub-pixel R, a green sub-pixel G, and a blue sub-pixel B. Each pixel 22 may have the same sub-pixel layout (e.g., the sub-pixels are in the same relative location in each pixel in the array).

In FIG. 22B, the pixels are arranged in a grid such that each row of pixels is placed directly below the preceding row of pixels. Consider the center of each red sub-pixel as an indicator of the pixel layout. The red sub-pixels are arranged in a line 210 that extends vertically across the display. In other words, line 210 is parallel to the left edge 204 of the display and orthogonal to the upper edge 202 of the display. This may be referred to as a vertical pixel pattern (because each pixel is positioned vertically below the pixel in the row above). Said another way, there is no lateral shift between each row and a preceding row.

The longitudinal axis 206 of a lenticular lens is overlaid on FIG. 22B to show the angle between the longitudinal axis 206 and the axis 210 that defines the pixel pattern. As shown in FIG. 22B, angle 212 between the pixel pattern axis and the longitudinal axis is greater than 0°, Angle 212 may have any desired magnitude (e.g., greater than 0°, greater than 5°, greater than 10°, greater than 20°, greater than 30°, between 0° and 30°, between 10° and 30°, between 10° and 25° between 15° and 25° etc.).

To summarize, in FIGS. 22A and 22B there is an angle (212) between the longitudinal axes of the lenticular lenses and the underlying pixel pattern. In FIG. 22B, the lenticular lenses are at an angle relative to the upper edge of the display whereas the pixel array follows a vertical pixel pattern that is orthogonal to the upper edge of the display. However, this example is merely illustrative. If desired, the angle between the longitudinal axes of the lenticular lenses and the underlying pixel pattern may be maintained while having the longitudinal axes of the lenticular lenses be orthogonal to the upper edge of the display.

Figure 23A:
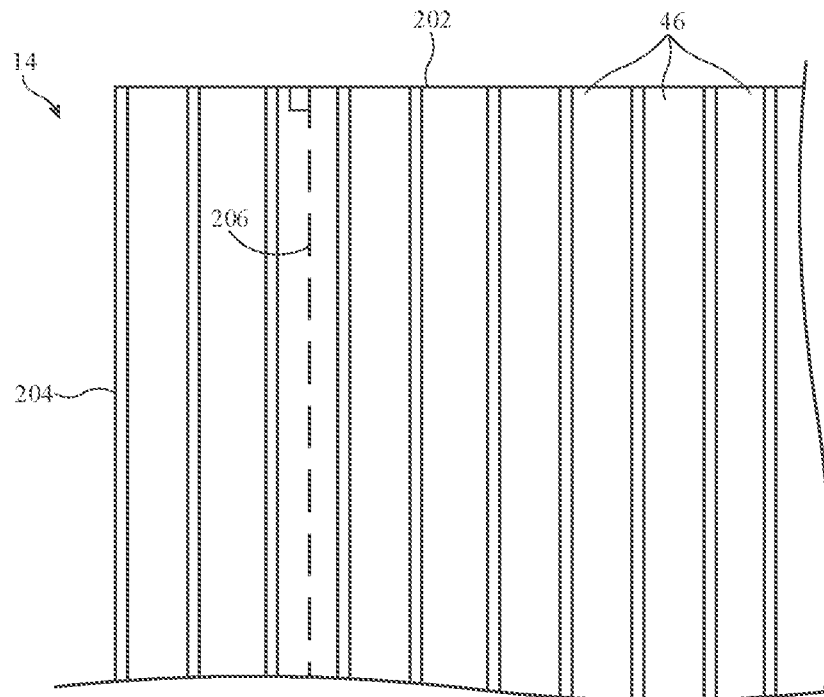
FIGS. 23A and 23B are top views of an illustrative display showing how vertically oriented lenticular lenses may be formed over a diagonal pixel pattern in accordance with an embodiment.
Figure 23B:
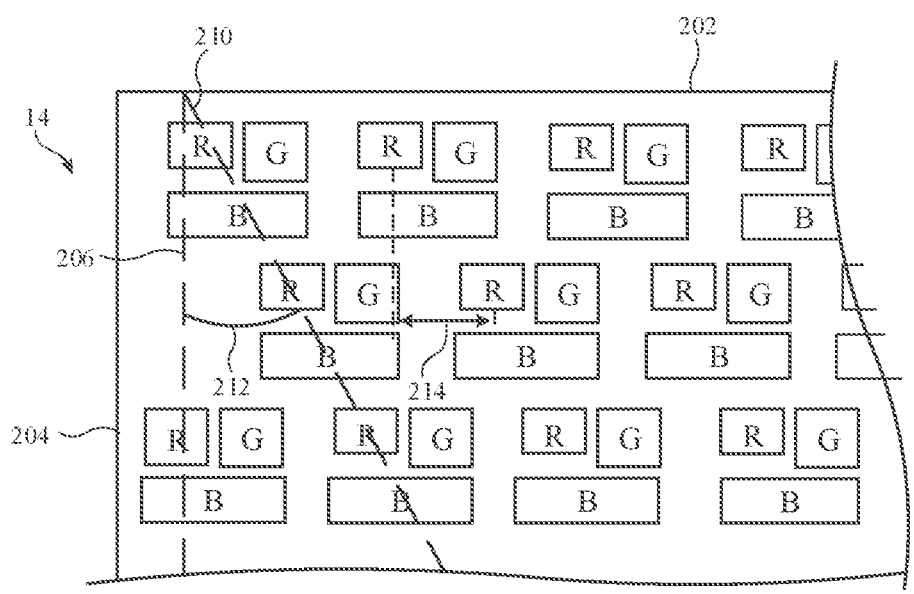

FIGS. 23A and 23B are top views of an illustrative display showing how the pixel rows may be shifted such that there is an angle between the pixel pattern and the lenticular lenses. As shown in FIG. 23A, each lenticular lens 46 may extend along an axis 206 that is orthogonal to the upper edge 202 of the display. Having the lenticular lenses 46 run orthogonal to the upper and lower edges of the display (and parallel to the left and right edges of the display) in this manner may result in the lenticular lenses being less detectable to a viewer during operation of the display.

Although having lenticular lenses 46 run orthogonal to the edges of the display (as in FIG. 23A) may be desirable for certain design criteria, it may still be desirable for the lenticular lenses to extend diagonally across the pixel array. In FIG. 22A, the lenticular lenses extend diagonally relative to the display borders and the pixel array has a vertical layout. In FIGS. 23A and 23B, the lenticular lenses are orthogonal to the display borders and the pixel array may extend diagonally relative to the display borders.

FIG. 23B is a top view of an illustrative pixel array having a row shift to produce the desired angle between the pixel array and lenticular lenses. As shown in FIG. 23B, each row of pixels may be offset from the above row of pixels. Consider the center of each red sub-pixel as an indicator of the pixel layout. The red sub-pixels are arranged in a line 210 that extends diagonally across the display. In other words, line 210 is not parallel to the left edge 204 of the display and is not orthogonal to the upper edge 202 of the display. This may be referred to as a diagonal pixel pattern or diagonal pixel layout (because each pixel is positioned diagonally below the pixel in the row above).

The longitudinal axis 206 of a lenticular lens is overlaid on FIG. 23B to show the angle between the longitudinal axis 206 and the axis 210 that defines the pixel pattern. As shown in FIG. 23B, angle 212 between the pixel pattern axis and the longitudinal axis is greater than 0. Angle 212 may have any desired magnitude (e.g., greater than 0°, greater than 5, greater than 10°, greater than 20°, greater than 30°, between 0° and 30°, between 10° and 30°, between 10° and 25°, between 15° and 25°, between 5° and 30° etc.).

The diagonal pattern of FIG. 23B may be the result of a shift of each row relative to the preceding row. For example, in FIG. 23B each red sub-pixel is laterally sifted by distance 214 relative to the red sub-pixel of the preceding row. This row shift results in the diagonal line 210 that defines the pixel array pattern in FIG. 23B. Distance 214 may be greater than 0 and less than the center-to-center pitch of adjacent pixels in a single row.

The illustrative pixel layouts shown in FIGS. 22B and 23B are merely illustrative. Other pixel layouts may be used as desired. For example, some pixel layouts may include diamond shaped sub-pixels (e.g., sub-pixels that are rotated relative to the edges of the display). The shapes and size of each sub-pixel may be selected based on the particular design constraints for a given display.

Figure 24:
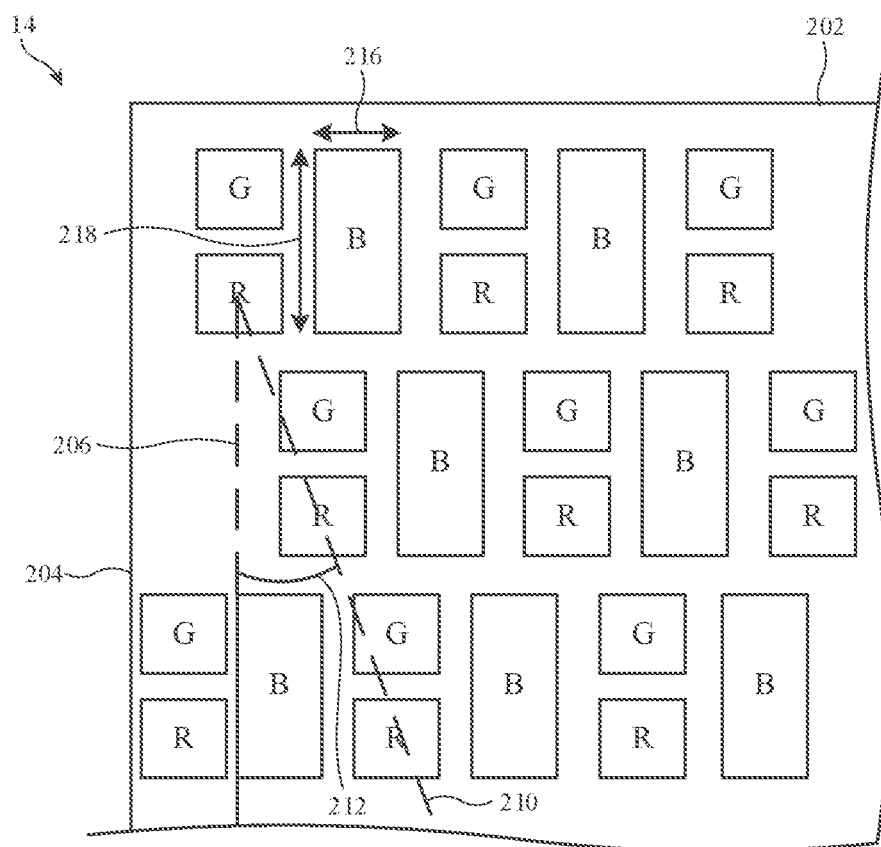
FIG. 24 is a top view of an illustrative diagonal pixel pattern where each pixel has a blue sub-pixel with a length oriented parallel to the lenticular lenses in accordance with an embodiment.

One alternate pixel layout possibility is shown in FIG. 24. The layout of FIG. 24 is similar to the layout of FIG. 23B. The pixels may have a diagonal layout that follows axis 210 which is at a non-zero angle 212 relative to the axis 206 of the lenticular lenses. However, in FIG. 24 the orientation of each blue sub-pixel is changed relative to the pattern of FIG. 23B.

As shown in FIG. 24, each blue sub-pixel has a width 216 and a length 218 (where the length is longer than the width). In the layout of FIG. 23B, the length of each blue sub-pixel extends orthogonal to the longitudinal axis 206 of the lenticular lenses. To mitigate cross-talk, in FIG. 24 the length of each blue sub-pixel extends parallel to the longitudinal axis 206 of the lenticular lenses. This results in the shorter dimension of the blue sub-pixels being orthogonal to the lenticular lenses (and the longer dimension of the blue sub-pixels being parallel to the lenticular lenses). Arranging the blue sub-pixels in this way may mitigate cross-talk, because a lenticular lens is less likely to partially overlap a blue sub-pixel.

Figure 25:
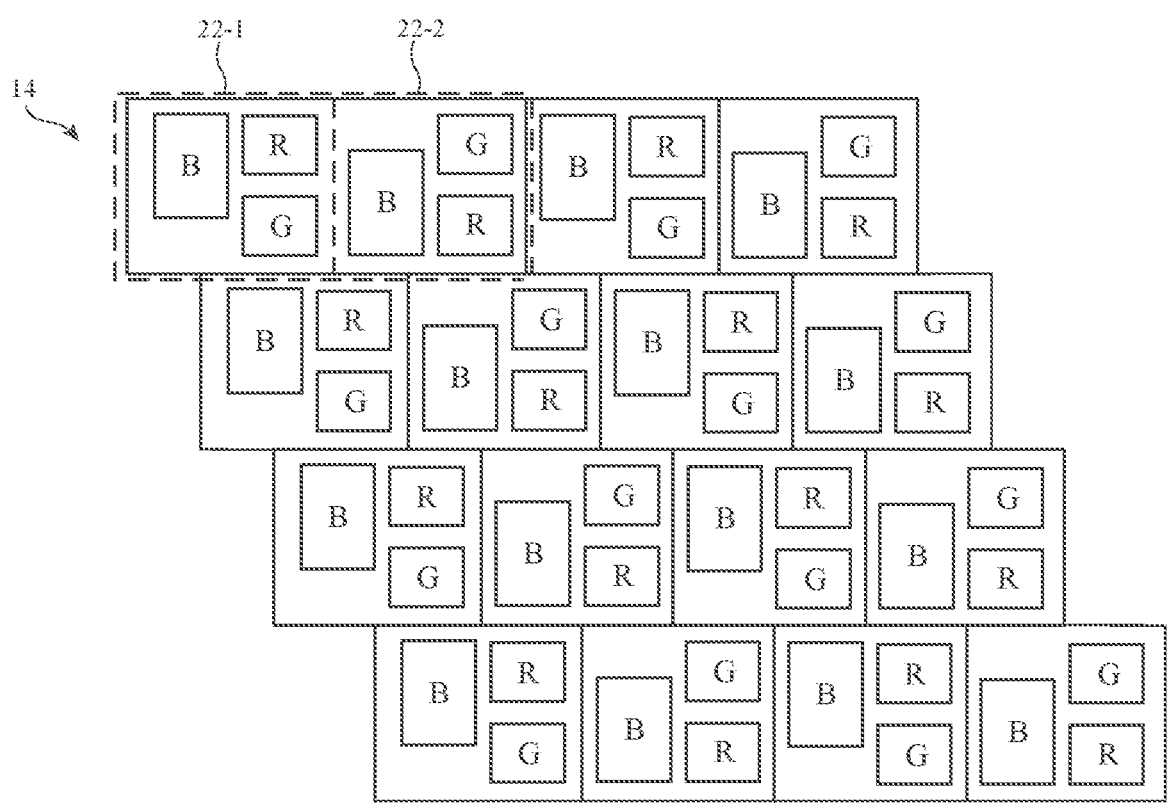
FIG. 25 is a top view of an illustrative pixel layout for a diagonal pixel pattern where each pixel has a blue sub-pixel with a length oriented parallel to the lenticular lenses and every pixel is flipped vertically relative to the adjacent pixels in accordance with an embodiment.
Figure 26:
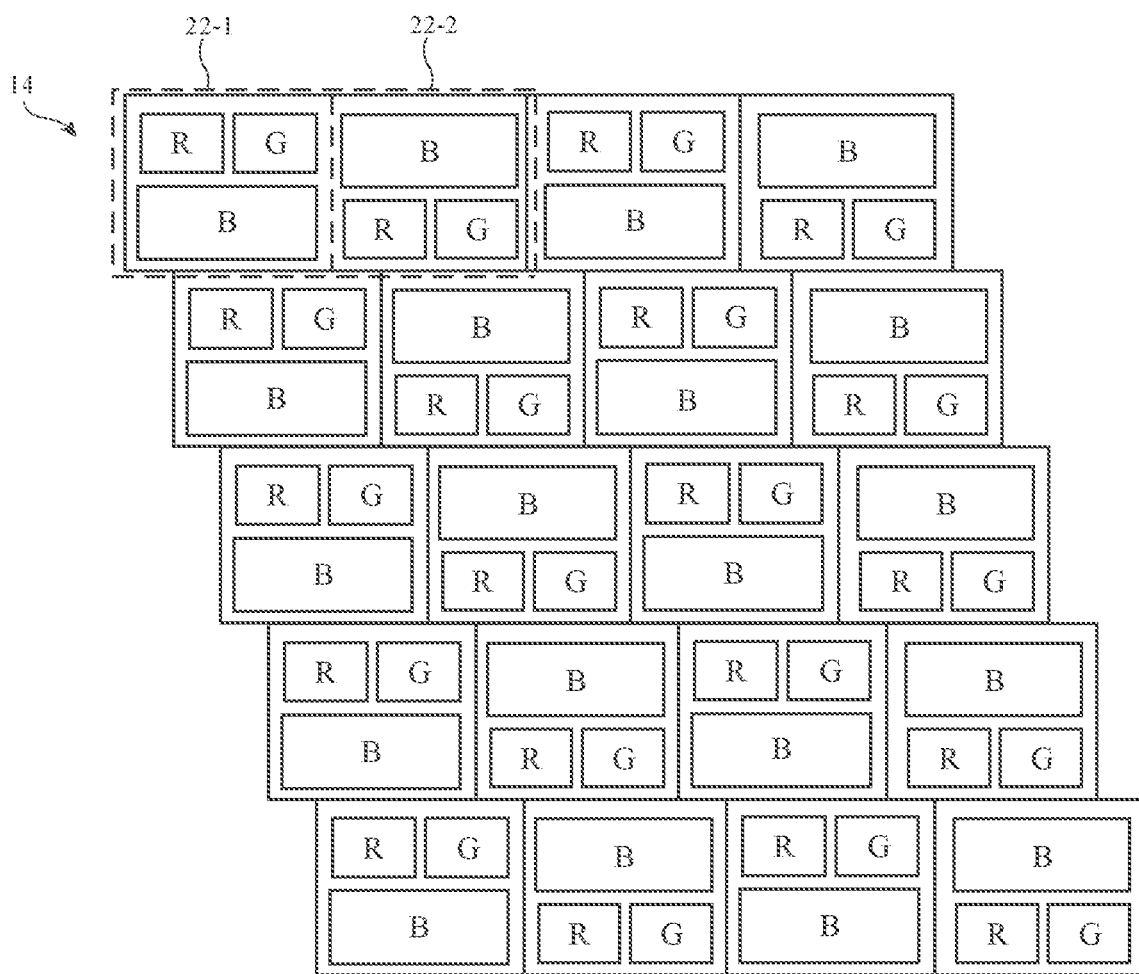
FIG. 26 is a top view of an illustrative pixel layout for a diagonal pixel pattern where each pixel has a blue sub-pixel with a length oriented orthogonal to the lenticular lenses and every pixel is flipped vertically relative to the adjacent pixels in accordance with an embodiment.
Figure 27:
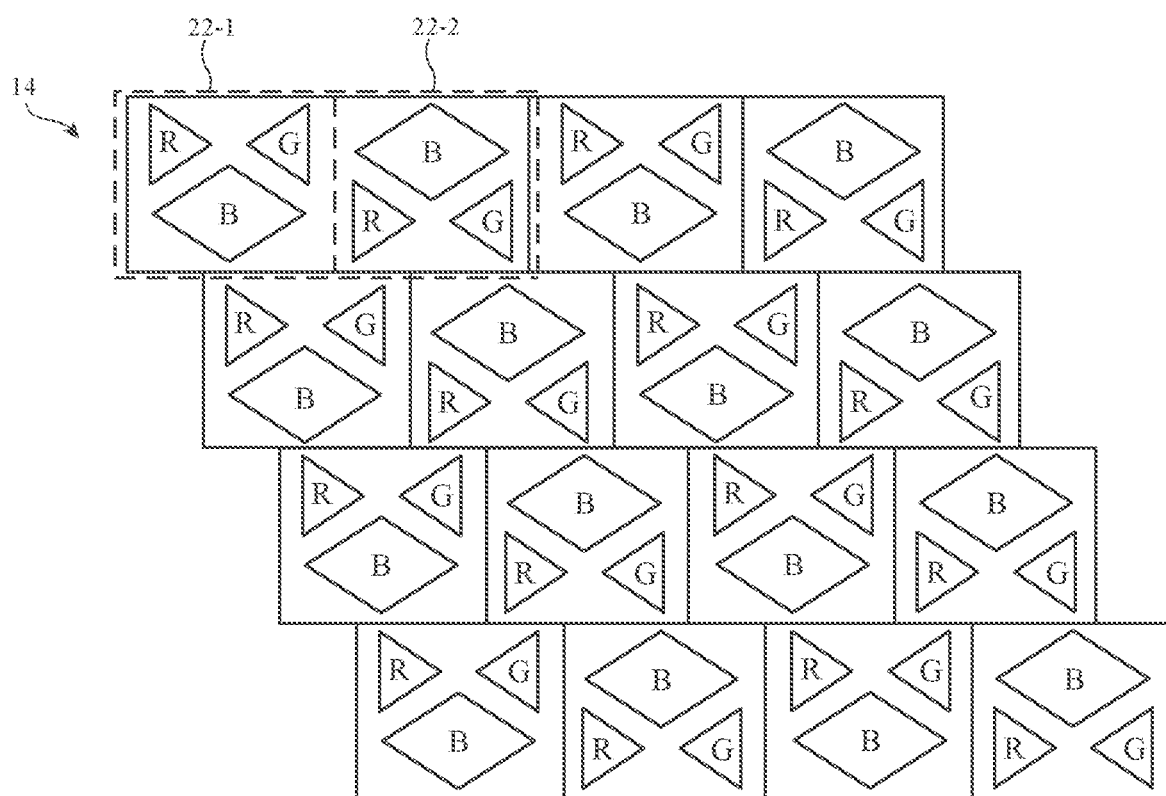
FIG. 27 is a top view of an illustrative diagonal pixel pattern where each pixel has diamond and triangular shaped sub-pixels in accordance with an embodiment.

Additional pixel layout options are shown in FIGS. 25-27. FIGS. 25-27 show illustrative examples where more than one pixel layout is used in the pixel array. In the example of FIG. 25, the pixels have a diagonal arrangement (as discussed in connection with FIGS. 23B and 24) and may be covered by vertical lenticular lenses. However, the layout of the pixels vary.

As shown in FIG. 25, the display includes pixels 22-1 with a first layout and pixels 22-2 with a second layout. In the first layout (of pixels 22-1), the blue sub-pixel (B) is oriented vertically (e.g., with the length extending vertically, parallel to the lenticular lenses) similar to as in FIG. 24. Additionally, pixels 22-1 include a red sub-pixel (R) that is positioned over a green sub-pixel (G). Pixels 22-2 have a similar layout to pixels 22-1. However, the layout in pixels 22-2 is flipped vertically relative to the layout of pixels 22-1. In pixels 22-1, the blue pixel is adjacent to the upper edge of the pixel. In contrast, in pixel 22-2 the blue pixel is adjacent to the lower edge of the pixel. Additionally, in pixel 22-2 the green sub-pixel is positioned above the red sub-pixel (instead of the opposite arrangement in pixel 22-1).

Every other pixel in a given row may have the same layout. As shown in FIG. 25, the pixels 22-1 of the first layout alternate with the pixels 22-2 of the second layout. Therefore, each diagonal column of pixels has pixels of a single layout. However, the pixel layout in each column alternates.

In the example of FIG. 26, the pixels have a diagonal arrangement (as discussed in connection with FIGS. 23B and 24) and may be covered by vertical lenticular lenses. The display includes pixels 22-1 with a first layout and pixels 22-2 with a second layout. In the first layout (of pixels 22-1), the blue sub-pixel (B) is oriented horizontally (e.g., with the length extending horizontally) similar to as in FIG. 23B. Additionally, pixels 22-1 include a red sub-pixel (R) that is positioned to the left of a green sub-pixel (G). The red and green sub-pixels are positioned over the blue sub-pixel in pixels 22-1. Pixels 22-2 have a similar layout to pixels 22-1. However, the layout in pixels 22-2 is flipped vertically relative to the layout of pixels 22-1. In pixels 22-1, the blue pixel is adjacent to the lower edge of the pixel. In contrast, in pixel 22-2 the blue pixel is adjacent to the upper edge of the pixel. Additionally, in pixels 22-2 the green and red sub-pixels are positioned below the blue sub-pixel (instead of the opposite arrangement in pixel 22-1).

Every other pixel in a given row may have the same layout. As shown in FIG. 26, the pixels 22-1 of the first layout alternate with the pixels 22-2 of the second layout. Therefore, each diagonal column of pixels has pixels of a single layout. However, the pixel layout in each column alternates.

In the example of FIG. 27, the pixels again have a diagonal arrangement (as discussed in connection with FIGS. 23B and 24) and may be covered by vertical lenticular lenses. The pixels in FIG. 27 may have diamond and/or triangular shaped sub-pixels (instead of only rectangles as in FIGS. 25 and 26).

As shown in FIG. 27, the display includes pixels 22-1 with a first layout and pixels 22-2 with a second layout. In the first layout (of pixels 22-1), the blue sub-pixel (B) is diamond shaped (e.g., has an edge that is rotated relative to the upper edge of the pixel/display). In other words, the blue sub-pixel has an edge that is neither parallel nor orthogonal to the upper edge of the pixel. Additionally, pixels 22-1 include a red sub-pixel (R) that is positioned to the left of a green sub-pixel (G). The red and green sub-pixels have a triangular shape. The red and green sub-pixels are positioned over the blue sub-pixel in pixel 22-1.

Pixels 22-2 have a similar layout to pixels 22-1. However, the layout in pixels 22-2 is flipped vertically relative to the layout of pixels 22-1. In pixels 22-1, the blue pixel is adjacent to the lower edge of the pixel. In contrast, in pixel 22-2 the blue pixel is adjacent to the upper edge of the pixel. Additionally, in pixels 22-2 the green and red sub-pixels are positioned below the blue sub-pixel (instead of the opposite arrangement in pixel 22-1).

Every other pixel in a given row may have the same layout. As shown in FIG. 27, the pixels 22-1 of the first layout alternate with the pixels 22-2 of the second layout. Therefore, each diagonal column of pixels has pixels of a single layout. However, the pixel layout in each column alternates.

The example of diamond and triangular sub-pixels in FIG. 27 is merely illustrative. In general, each sub-pixel may have any desired shape depending upon the particular display. The different pixel layouts may minimize cross-talk and optimize display performance depending on the pixel pitch, lenticular lens layout, etc.

In some cases, different pixel layouts may be used in different portions of the display. For example, instead of having a uniform pattern across the entire display (e.g., the same layout for every pixel, every other column having pixels with the same layout as in FIGS. 25-27, etc.), different portions of the display may have different pixel layouts (e.g., in a non-periodic manner). For example, the central portion of the pixel array may have a different pixel layout pattern than the edges of the pixel array.

The signal paths such as data lines D and control lines G (sometimes referred to as gate lines, scan lines, emission control lines, etc.) may be modified to accommodate the row shifting of the pixel arrays of FIGS. 23B and 24-27. In a display with a vertically arranged pixel array (e.g., as in FIG. 22B), the data lines D may all extend in a first direction (e.g., orthogonal to the upper edge of the display or orthogonal to a side edge of the display) and the gate lines G may all extend in a second direction that is orthogonal to the first direction. However, the row shift of FIGS. 23B and 24-27 and resulting diagonal pixel array results in modifications to the signal paths.

Figure 28:
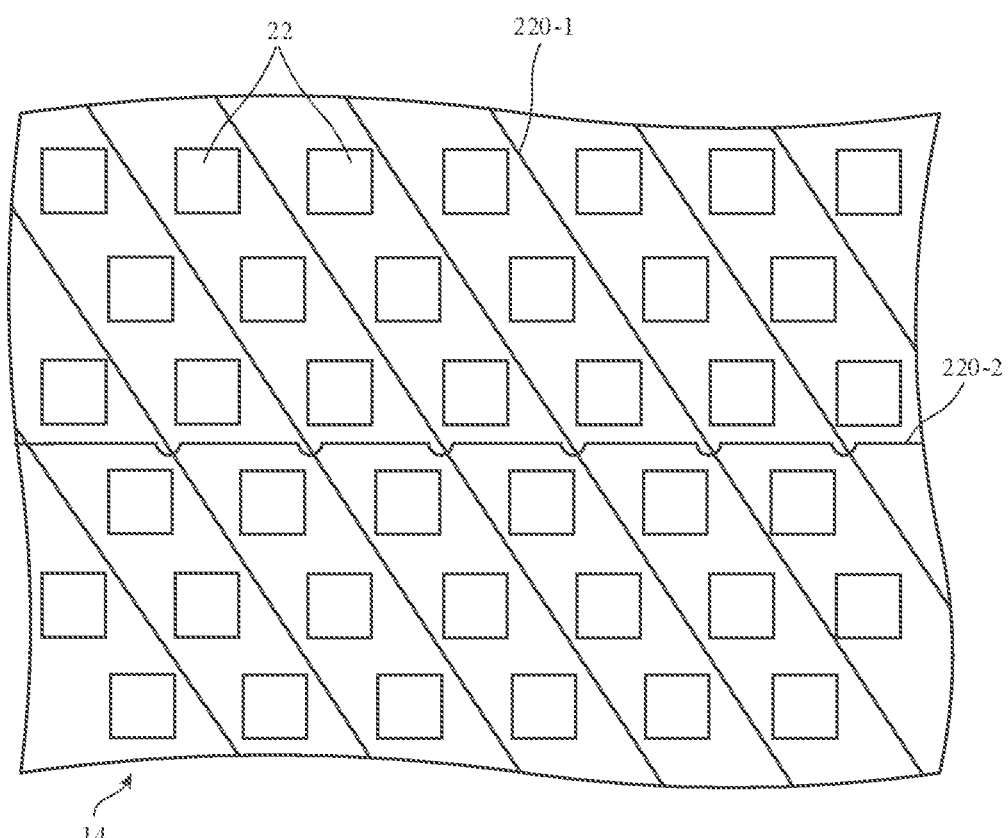
FIG. 28 is a top view of an illustrative display showing how diagonal signal paths may be used to accommodate a diagonal pixel pattern in accordance with an embodiment.

FIG. 28 is a top view of an illustrative display showing an illustrative example where the signal paths 220-1 (e.g., the data lines or the gate lines) extend diagonally across the array in a continuous fashion. The signal paths 220-1 may extend parallel to the axis 210 shown in FIG. 23B or FIG. 24. The signal paths 220-1 (e.g., that extend from the upper edge of the display towards the lower edge of the display) may also be at a non-orthogonal angle relative to additional signal paths 220-2 (e.g., that extend from the left edge of the display towards the right edge of the display). The angle of signal path 220-1 relative to signal path 220-2 may be less than 90°, less than 85, less than 80°, less than 70°, less than 60°, between 60° and 90°, between 60° and 80°, between 65° and 80° between 65° and 75°, etc.

In some situations, the display driver circuitry may be formed at the upper or lower edge of the display and the gate driver circuitry may be formed at the left or right edge of the display. In these cases, signal paths 220-1 may be data lines and signal paths 220-2 may be gate lines. In other arrangements, the gate driver circuitry may be formed at the upper or lower edge of the display and the display driver circuitry may be formed at the left or right edge of the display. In these cases, signal paths 220-1 may be gate lines and signal paths 220-2 may be data lines.

It should be understood that the labeling of the 'upper' edge of the display is merely illustrative. In some cases, the display may have an active area with one or more curved borders (e.g., rounded corners, curved edges, etc.). The edges may therefore not be strictly linear as with a purely rectangular display. However, the terms upper edge, lower edge, left edge, and right edge may still be used to characterize displays of this type. Angles described in relation the edges of the display may also be considered relative to the upper edge of the electronic device or an approximate edge based on the orientation of the device during use. For example, if the device has an active area with a curved upper edge, the aforementioned angles described relative to the upper edge may instead be applicable to a horizontal line that is at the top of the display during use of the electronic device.

Figure 29:
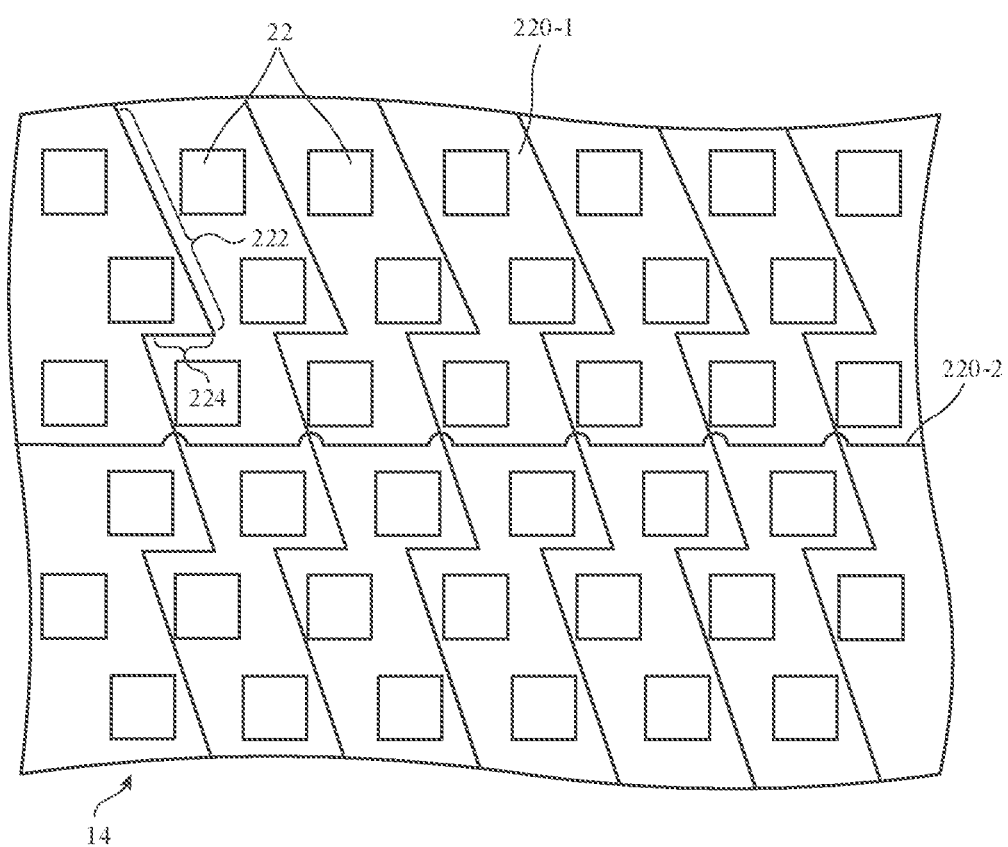
FIG. 29 is a top view of an illustrative display showing how zig-zag signal paths may be used to accommodate a diagonal pixel pattern in accordance with an embodiment.

FIG. 29 is a top view of an illustrative display showing an illustrative example where the signal paths 220-1 (e.g., the data lines or the gate lines) extend in a zig-zag pattern across the array. The signal paths 220-1 may have a zig-zag shape such that the signal paths generally extend vertically downward instead of both laterally and downward as in FIG. 28. The signal path may have diagonal segments 222 and intervening horizontal (or substantially horizontal) segments 224. The diagonal segments may extend both downward and laterally in a first direction. The horizontal segments may then extend laterally in a second direction that is the opposite of the first direction. The exact path and layout of the zig-zag signal paths may be selected based on the particular pixel layout of a given display. In general, any desired zig-zag paths may be used. Each diagonal and horizontal segment of the zig-zag signal path may have any desired length and may extend past any desired number of pixels (e.g., one, two, three, four, more than four, more than ten, more than twenty, between two and ten, etc.).

The diagonal segments 222 may be at a non-orthogonal angle relative to additional signal paths 220-2 (e.g., that extend from the left edge of the display towards the right edge of the display). The angle of segments 222 relative to signal path 220-2 may be less than 90°, less than 85°, less than 80°, less than 70°, less than 60° between 60° and 90° between 60° and 80°, between 65° and 80°, between 65° and 75° etc. Horizontal segments 224 may be parallel to signal path 220-2.

In FIG. 29, it should be understood that in some situations, the display driver circuitry may be formed at the upper or lower edge of the display and the gate driver circuitry may be formed at the left or right edge of the display. In these cases, signal paths 220-1 may be data lines and signal paths 220-2 may be gate lines. In other arrangements, the gate driver circuitry may be formed at the upper or lower edge of the display and the display driver circuitry may be formed at the left or right edge of the display. In these cases, signal paths 220-1 may be gate lines and signal paths 220-2 may be data lines.

Figure 30:
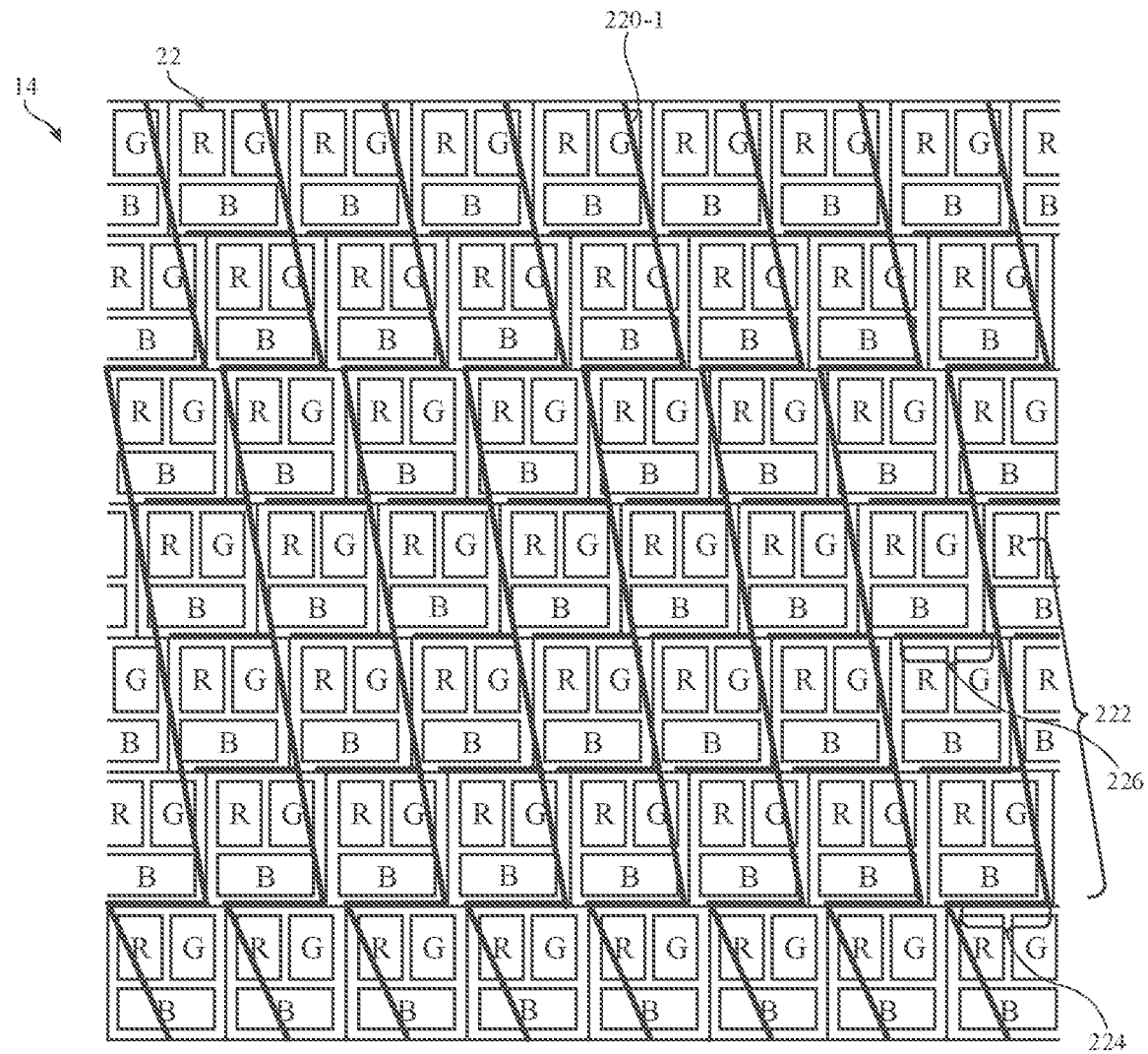
FIG. 30 is a top view of an illustrative display showing how zig-zag signal paths with supplemental segments to equalize loading may be used to accommodate a diagonal pixel pattern in accordance with an embodiment.

FIG. 30 is a top view of an illustrative display with zig-zag signal paths showing a specific example where the diagonal segments extend past four pixels and the horizontal segments extend past one pixel. In general, each diagonal segment 222 of signal path 220-1 across the pixel array may extend diagonally past four pixels. A horizontal segment 224 then extends past one pixel horizontally. The horizontal segment 224 may increase the loading on the signal path (e.g., because the signal path travels a longer distance to reach the next pixel when the intervening horizontal segment is present).

To equalize the loading along the signal path, supplemental segments 226 may be included in signal path 220-1. Without supplemental segments 226, the signal path may have an increased load every fourth row (e.g., because the horizontal segment 224 is required every four rows). Therefore, a supplemental segment 226 may be added to the signal path at the three rows between the horizontal segments 224. Each supplemental segment may have a length that is approximately equal to (e.g., within 20% of, within 10% of, within 5% of, within 1% of, etc.) the length of the horizontal segments 224.

In FIG. 30, supplemental segments 226 are electrically connected to the rest of signal paths 220-1. This example is merely illustrative. In another possible arrangement, shown in FIG. 31, a display may include zig-zag signal paths with dummy segments. In general, each diagonal segment 222 of signal path 220-1 across the pixel array may extend diagonally past four pixels. A horizontal segment 224 then extends past one pixel horizontally. The horizontal segment 224 may increase the loading on the signal path (e.g., because the signal path travels a longer distance to reach the next pixel when the intervening horizontal segment is present).

Figure 31:
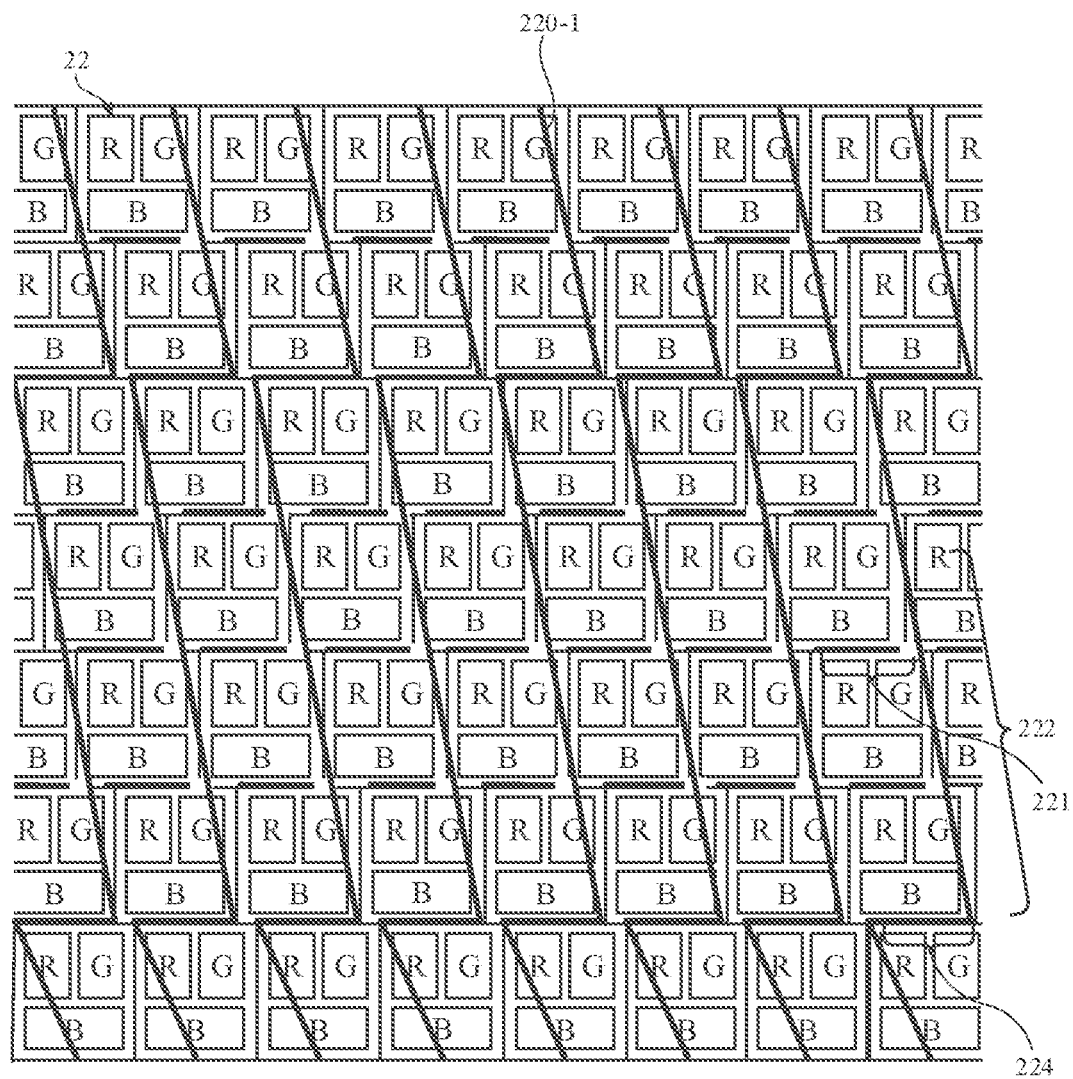
FIG. 31 is a top view of an illustrative display showing how zig-zag signal paths with dummy segments to equalize loading may be used to accommodate a diagonal pixel pattern in accordance with an embodiment.

To equalize the loading along the signal path, dummy segments 221 in FIG. 31 may be interposed between adjacent pixels. For example, the dummy segments may extend horizontally between pixels in the same diagonal column (and different rows) where a horizontal segment 224 is not already present. Similar to supplemental segments 226 as discussed above in connection with FIG. 30, dummy segments 221 may equalize the loading across the display. Each dummy segment 221 may be electrically connected to a bias voltage (e.g. a ground power supply voltage or positive power supply voltage). Each dummy segment 221 may have a length that is approximately equal to (e.g., within 20% of, within 10% of, within 5% of, within 1% of, etc.) the length of the horizontal segments 224.

It should be understood that the aforementioned pixel layouts and signal path layouts may be used in any combination. Additionally, the aforementioned pixel layouts and signal path layouts may be used for any of the previously described displays (e.g., convex curved displays and/or displays including louver films).

The foregoing is merely illustrative and various modifications can be made to the described embodiments. The foregoing embodiments may be implemented individually or in any combination.

The invention claimed is:

1. A display comprising:
   a substrate having convex curvature;
   an array of pixels formed on the substrate;
   lenticular lenses formed over the array of pixels; and
   a louver film formed over the array of pixels, wherein the louver film has a plurality of opaque portions and a plurality of transparent portions, wherein each one of the plurality of opaque portions extends along an axis between an upper surface of the louver film and a lower surface of the louver film, wherein a first opaque portion in a center of the display has a respective first axis that is orthogonal to the upper surface of the louver film, and wherein a second opaque portion in an edge of the display has a respective second axis that is non-orthogonal to the upper surface of the louver film.

2. The display defined in claim 1, wherein the first and second axes are parallel.

3. The display defined in claim 1, wherein the plurality of opaque portions controls an emission angle of light from the display.

4. The display defined in claim 1, wherein the lenticular lenses are part of a lenticular lens film, wherein the lenticular lens film comprises a base portion, and wherein the lenticular lenses are formed directly on the base portion.

5. The display defined in claim 4, wherein the louver film is interposed between the array of pixels and the lenticular lens film.

6. The display defined in claim 4, wherein the lenticular lens film is interposed between the array of pixels and the louver film.

7. The display defined in claim 4, further comprising:
   a film that is formed over the lenticular lens film that conforms to the lenticular lenses, wherein the film has a lower surface that is in direct contact with the lenticular lenses and an upper surface with the convex curvature.

8. The display defined in claim 4, further comprising:
   a polarizer that is interposed between the array of pixels and the lenticular lens film.

9. The display defined in claim 1, wherein the array of pixels and the louver film conform to the substrate and have the convex curvature.

10. A display comprising:
    a substrate having convex curvature;
    an array of pixels formed on the substrate;
    lenticular lenses formed over the array of pixels;
    a film that is formed over the lenticular lenses and that conforms to the lenticular lenses; and
    a louver film formed over the array of pixels, wherein the film has a first refractive index, wherein the lenticular lenses have a second refractive index, and wherein the first refractive index is lower than the second refractive index.

11. The display defined in claim 10, wherein the array of pixels and the louver film conform to the substrate and have the convex curvature.

12. The display defined in claim 10, wherein the louver film comprises a plurality of selectively opaque portions.

13. The display defined in claim 10, further comprising:
    a polarizer that is interposed between the array of pixels and the lenticular lens film.

14. The display defined in claim 10, wherein the louver film has transparent portions that are separated by opaque walls.

15. The display defined in claim 10, wherein the louver film has a plurality of opaque portions and a plurality of transparent portions.

16. The display defined in claim 15, wherein the plurality of opaque portions controls an emission angle of light from the display.

17. The display defined in claim 10, wherein the lenticular lenses are part of a lenticular lens film, wherein the lenticular lens film comprises a base portion, and wherein the lenticular lenses are formed directly on the base portion.

18. The display defined in claim 17, wherein the louver film is interposed between the array of pixels and the lenticular lens film.

19. The display defined in claim 17, wherein the lenticular lens film is interposed between the array of pixels and the louver film.

* * * * *